United States Patent
Moody et al.

(10) Patent No.: US 12,438,506 B1
(45) Date of Patent: Oct. 7, 2025

(54) COMPLEMENTARY CURRENT REUSE EVEN HARMONIC FREQUENCY MULTIPLIER

(71) Applicant: National Technology & Engineering Solutions of Sandia, LLC, Albuquerque, NM (US)

(72) Inventors: Jesse Moody, Cedar Crest, NM (US); Travis Forbes, Overland Park, KS (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 101 days.

(21) Appl. No.: 18/415,778

(22) Filed: Jan. 18, 2024

Related U.S. Application Data

(60) Provisional application No. 63/440,725, filed on Jan. 24, 2023.

(51) Int. Cl.
*H03B 19/10* (2006.01)
*H03B 5/12* (2006.01)
(Continued)

(52) U.S. Cl.
CPC ............ *H03B 19/10* (2013.01); *H03B 5/1228* (2013.01); *H03F 1/086* (2013.01); *H03F 3/4521* (2013.01);
(Continued)

(58) Field of Classification Search
CPC ........ H03B 19/10; H03B 5/1228; H03B 5/12; H03B 19/14; H03B 19/00; H03F 1/086;
(Continued)

(56) References Cited

U.S. PATENT DOCUMENTS 10,855,225 B1 * 12/2020 Taghivand ........... H04B 1/0057

OTHER PUBLICATIONS

Iotti, L. et al., "A 12mW 70-to-100GHz Mixer-First Receiver Front-End for mm-Wave Massive-MIMO Arrays in 28nm CMOS," ISSCC 2018/Session 26/RF Techniques for Communication and Sensing/26.8, 3 pages.
(Continued)

*Primary Examiner* — Jung Kim
(74) *Attorney, Agent, or Firm* — Mark A. Dodd

(57) ABSTRACT

An even harmonic multiplier employing complementary current reuse is disclosed. The even harmonic multiplier employs supply voltage and current density scaling to reduce power consumption. Further, by using complimentary NMOS and PMOS transistors, the even harmonic multiplier achieves high areal efficiency. Current reuse causes a reduction in noise at the first harmonic, as the corresponding first harmonic currents from the NMOS and PMOS transistors are in opposite, i.e., canceling, directions. Complementary current reuse is now feasible, as the performance of PMOS transistors at current process nodes is similar to those of NMOS transistors, with appropriate sizing leading to approximately equivalent transconductances. Multiple even harmonic multiplier configurations are possible, with many using transformer circuits at the input and/or the output. The resultant even harmonic multipliers find ready application in millimeter wave radio frequency receivers. The most common even harmonic multiplier is a frequency doubler, which produces a strong second harmonic signal.

19 Claims, 24 Drawing Sheets

(51) Int. Cl.
*H03F 1/08* (2006.01)
*H03F 3/45* (2006.01)
(52) U.S. Cl.
CPC .. *H03F 2200/294* (2013.01); *H03F 2200/451* (2013.01)
(58) Field of Classification Search
CPC ............. H03F 3/4521; H03F 2200/294; H03F 2200/451; G06F 7/68; H03K 5/156; H03K 5/00006
See application file for complete search history.

(56) References Cited

OTHER PUBLICATIONS

Jang, T. H. et al., "120-GHz Wideband I/Q Receiver Based on Baseband Equalizing Technique," IEEE Journal of Solid-State Circuits (2021) 56(6):1697-1710.

Kankuppe, A. et al., "A Wideband 62-mW 60-GHz FMCW Radar in 28-nm CMOS," IEEE Transactions on Microwave Theory and Techniques (2021) 69(6):2921-2935.

Murakami, T. et al., "A 9 dB Noise Figure Fully Integrated 79 GHZ Automotive Radar Receiver in 40 nm CMOS Technology," 2019 IEEE Radio Frequency Integrated Circuits Symposium, 4 pages.

Papotto, G. et al., "A 27-mW W-Band Radar Receiver With Effective TX Leakage Suppression in 28-nm FD-SOI CMOS," IEEE Transactions on Microwave Theory and Techniques (2021) 69(9):4132-4141.

Vigilante, M. et al., "On the Design of Wideband Transformer-Based Fourth Order Matching Networks for E-Band Receivers in 28-nm CMOS," IEEE Journal of Solid-State Circuits (2017) 52(8):2071-2082.

* cited by examiner

1100

1200

COMPLEMENTARY CURRENT REUSE EVEN HARMONIC FREQUENCY MULTIPLIER

CROSS-REFERENCE TO RELATED APPLICATIONS

This application claims priority to U.S. Provisional Application No. 63/440,725, filed on Jan. 24, 2023, and entitled COMPLEMENTARY CURRENT REUSE PUSH PUSH FREQUENCY DOUBLER, the entirety of which is incorporated herein by reference.

STATEMENT OF GOVERNMENT SUPPORT

This invention was made with Government support under Contract No. DE-NA0003525 awarded by the United States Department of Energy/National Nuclear Security Administration. The U.S. Government has certain rights in the invention.

BACKGROUND OF THE INVENTION

Field of the Invention

The present invention relates to an areal and power efficient even harmonic multiplier that employs complementary current reuse.

Brief Description of the Related Art

Power consumption in cube satellites and 5G applications significantly contributes to such systems' Size, Weight, and Power (SWaP). The power consumption problem in millimeter-wave (mmW) frequency bands is exasperated as these systems often employ large, transmit and/or receive phased arrays for increased antenna gain and beam steering. Such systems also consume higher amounts of power per element when compared to lower frequency bands. Intra-satellite communications and emerging WI-FI applications use V-band and often have stringent power consumption requirements. RF CMOS technologies present an excellent solution to these problems, providing incredibly high-frequency performance and scalability to very low power levels.

Large, phased array systems face the additional challenge of local oscillator (LO) distribution. At mmW frequencies, LO distribution is very difficult, which has led to subharmonic LO distribution. However, subharmonic LO distribution requires frequency multipliers, and often chains of frequency multipliers, to achieve the required LO frequency.

Examining the current state of the art in low-power mmW receivers indicates that there are still several areas for improvement to be addressed; either poor noise performance or high power consumption. Noise performance and receiver channel power consumption must be considered when designing for a desired phased array receiver Effective Isotropic Sensitivity (EIS). Receiver EIS is defined as an arrayed receiver's sensitivity normalizing the sensitivity to the antenna's gain or array and $EIS \propto \log(N_{elements}) - NF_{element}$. As the number of elements increases, EIS is improved at the cost of increased power consumption, suggesting that receivers with low power consumption and poor noise performance may not be optimal from a system power perspective.

Previous low-power mmW receiver efforts have (1) employed mixer-first architectures with poor noise performance, (2) produced receivers with low levels of integration, and/or (3) produced receivers that suffer from poor noise, bandwidth, or linearity.

Millimeter wave circuits typically use bias points optimized for maximum RF performance. These bias points employ high drain voltages, typically around the process node's nominal core supply voltage. These circuits also use channel current densities to optimize device $NF_{min}$ or $F_{max}$. Prior work has identified that optimum $NF_{min}$ occurs around 150 µA/µm in most silicon technologies, while 250 µA/µm provides maximum $F_{max}$. While these bias points extract the maximum performance level from a given silicon device, they do so at the cost of increased power consumption compared to lower voltage and current density operating points. These bias points are excellent for applications with minimal power constraints or requiring high frequency or high performance.

Thus, the need exists for an even harmonic multiplier circuit that optimizes supply voltage reduction (voltage scaling) and/or supply current density reduction (current density scaling) in a manner that minimizes power consumption and reduces occupied real estate in a corresponding integrated circuit.

SUMMARY OF THE INVENTION

One aspect of the present invention relates to an even harmonic multiplier employing complementary current reuse, combined with supply voltage and current density scaling. The resultant devices combine low power consumption due to the supply voltage and current density scaling, with high areal efficiency, making them ideal for millimeter wave radio frequency applications. Current reuse causes a drastic reduction in noise at the first harmonic, as the corresponding first harmonic currents from the NMOS and PMOS transistors are in opposite directions. Complementary current reuse is now feasible as the characteristics of PMOS transistors at current process nodes is similar to those of NMOS transistors. Multiple even harmonic multiplier configurations are possible, with most using transformer circuits at the input and/or the output. The most common even harmonic multiplier is a frequency doubler, which produces a strong second harmonic signal.

In at least a first primary embodiment, a complementary current reuse (CCR) even harmonic multiplier comprises first and second PMOS transistors (drains of the first and second PMOS transistors coupled together at a first output node), first and second NMOS transistors (drains of the first and second NMOS transistors coupled together at a second output node), a first input node (the first input node coupled to gates of the first PMOS and first NMOS transistors), and a second input node (the second input node coupled to gates of the second PMOS and second NMOS transistors), the first and second input nodes receiving an input signal at a frequency $F_0$, and the first and second output nodes outputting an output signal at a frequency $2nF_0$, where n is a positive integer.

In various embodiments, performance of the first and second PMOS transistors are substantially the same as performance of the first and second NMOS transistors; the CCR even harmonic multiplier further comprises an input transformer (a secondary coil of the input transformer coupled between the first and second input nodes, a primary coil of the input transformer receiving the input signal); the CCR even harmonic multiplier further comprises a first capacitor coupled between the gates of the first PMOS and first NMOS transistors and a second capacitor coupled between the gates of the second PMOS and second NMOS transistors; the CCR even harmonic multiplier further comprises first through fourth harmonic terminating networks (the first harmonic terminating network coupled to a source of the first PMOS transistor, the second harmonic terminating network coupled to a source of the second PMOS transistor, the third harmonic terminating network coupled to a source of the first NMOS transistor, and the fourth harmonic terminating network coupled to a source of the second NMOS transistor); and the CCR even harmonic multiplier further comprises first through fourth harmonic coupling networks (the first harmonic coupling network coupled between the drain of the first PMOS transistor and the first output node, the second harmonic coupling network coupled between the drain of the second PMOS transistor and the first output node, the third harmonic coupling network coupled between the drain of the first NMOS transistor and the second output node, and the fourth harmonic coupling network coupled between the drain of the second NMOS transistor and the second output node).

In other embodiments, the CCR even harmonic multiplier further comprises a network coupled between the first and second output nodes (the network providing impedance matching or coupling); the network includes an output transformer (a primary coil of the output transformer coupled between the first and second output nodes, a secondary coil of the output transformer outputting the output signal); the network includes a triple transformer (the triple transformer including first and second primary coils and a first secondary coil, the first and second primary coils coupled between the first and second output nodes, the first and second primary coils being of opposite polarity, a terminal of the first secondary coil outputting the output signal); and the network further includes a first coupling capacitor coupling the first primary coil to the first output node and a second coupling capacitor coupling the second primary coil to the second output node.

In still other embodiments, sizes of the first and second PMOS transistors and the first and second NMOS transistors provide substantially equivalent transconductances; and the CCR even harmonic multiplier further comprises first through fourth coupling capacitors (the first coupling capacitor coupled between the source of the first PMOS transistor and the gate of the second PMOS transistor, the second coupling capacitor coupled between the source of the second PMOS transistor and the gate of the first PMOS transistor, the third coupling capacitor coupled between the source of the first NMOS transistor and the gate of the second NMOS transistor, and the fourth coupling capacitor coupled between the source of the second NMOS transistor and the gate of the first NMOS transistor).

In at least a second primary embodiment, a receiver comprises an RF low noise amplifier amplifying an input signal and output the amplified input signal, a polyphase filter (the polyphase filter receiving an oscillator signal, generate 0° and a desired offset angle phase-shifted oscillator signals and outputting the 0° and desired offset angle phase-shifted oscillator signals), a pair of complementary current reuse (CCR) even harmonic multipliers (each CCR even harmonic amplifier including first and second PMOS transistors (drains of the first and second PMOS transistors coupled together at a first output node), first and second NMOS transistors (drains of the first and second NMOS transistors coupled together at a second output node), a first input node (the first input node coupled to gates of the first PMOS and first NMOS transistors), and a second input node (the second input node coupled to gates of the second PMOS and second NMOS transistors), the first and second input nodes receiving a respective one of the 0° or desired offset angle phase-shifted oscillator signals, and the first and second output nodes outputting a respective local oscillator (LO) signal at a frequency $2nF_0$ at a corresponding 0° or 90° phase shift, where n is a positive integer), a mixer (the mixer receiving and mixing the amplified input signal with the LO signals at the frequency $2nF_0$ at 0° and 90° phase shifts, and outputting corresponding I and Q signals), and a pair of baseband low noise amplifiers (each of the pair of baseband low noise amplifiers receiving a respective one of the I or Q signals, amplifying the respective one of the I or Q signals, and outputting a respective one of the thus amplified I or Q signals).

In various embodiments, performance of the first and second PMOS transistors of each of the pair of CCR even harmonic multipliers are substantially the same as performance of the first and second NMOS transistors of each of the pair of CCR even harmonic multipliers; each of the pair of CCR even harmonic multipliers further comprises an input transformer (a secondary coil of the input transformer coupled between the first and second input nodes, a primary coil of the input transformer receiving a respective one of the 0° or desired offset angle phase-shifted oscillator signals); and each of the pair of CCR even harmonic multipliers further comprises a first capacitor coupled between the gates of the first PMOS and first NMOS transistors and a second capacitor coupled between the gates of the second PMOS and second NMOS transistors.

In other embodiments, each of the pair of CCR even harmonic multipliers further comprises first through fourth harmonic terminating networks (the first harmonic terminating network coupled to a source of the first PMOS transistor, the second harmonic terminating network coupled to a source of the second PMOS transistor, the third harmonic terminating network coupled to a source of the first NMOS transistor, and the fourth harmonic terminating network coupled to a source of the second NMOS transistor); and each of the pair of CCR even harmonic multipliers further comprises first through fourth harmonic coupling networks (the first harmonic coupling network coupled between the drain of the first PMOS transistor and the first output node, the second harmonic coupling network coupled between the drain of the second PMOS transistor and the first output node, the third harmonic coupling network coupled between the drain of the first NMOS transistor and the second output node, and the fourth harmonic coupling network coupled between the drain of the second NMOS transistor and the second output node).

In still other embodiments, each of the pair of CCR even harmonic multipliers further comprises a network coupled between the first and second output nodes (the network including an output transformer or a triple transformer, the network providing impedance matching or coupling); and each of the pair of CCR even harmonic multipliers further comprises first through fourth coupling capacitors (the first coupling capacitor coupled between the source of the first PMOS transistor and the gate of the second PMOS transistor, the second coupling capacitor coupled between the source of the second PMOS transistor and the gate of the first PMOS transistor, the third coupling capacitor coupled between the source of the first NMOS transistor and the gate of the second NMOS transistor, and the fourth coupling capacitor coupled between the source of the second NMOS transistor and the gate of the first NMOS transistor).

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION OF THE INVENTION

Figure 1:
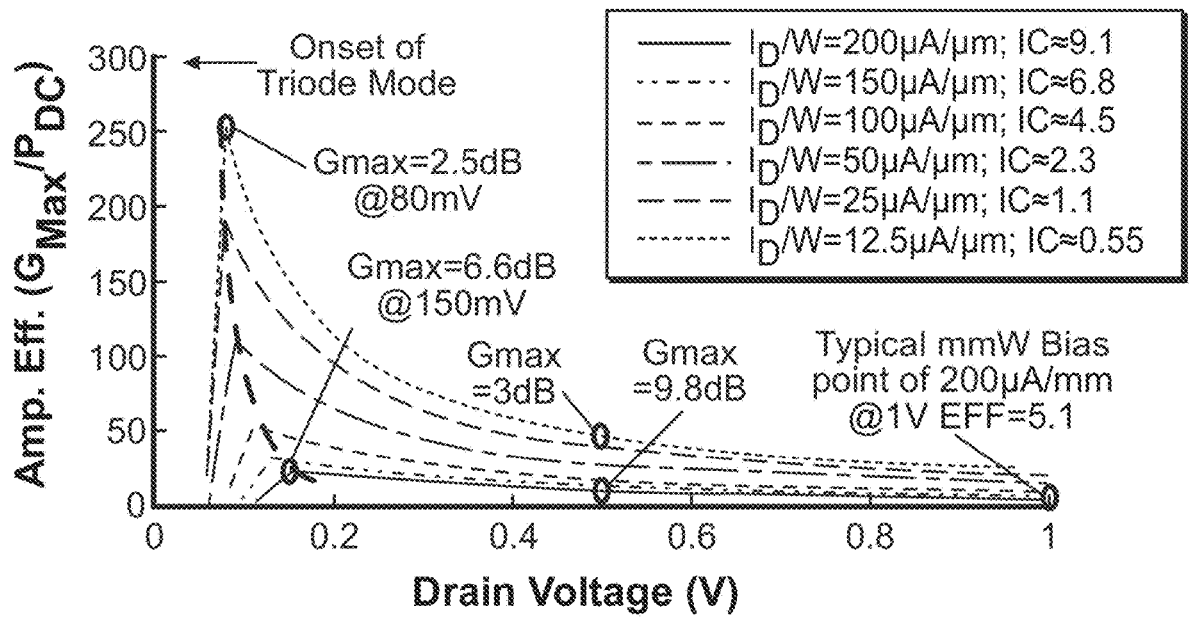
FIG. 1 illustrates simulated amplifier efficiency as a function of drain voltage that may be used to guide the design of complementary current reuse (CCR) frequency doublers in accordance with one or more embodiments of the present invention.

The terms "a" and "an" do not denote a limitation of quantity, but rather denote the presence of at least one of the referenced items. The term "or" means "and/or." The terms "comprising," "having," "including," and "containing" are to be construed as open-ended terms (i.e., meaning "including, but not limited to").

The term "even harmonic multiplier" refers to a device that efficiently produces energy at an even harmonic of the input signal. A frequency doubler is a special type of even harmonic multiplier that produces a strong second harmonic signal, and is by far the most common even harmonic multiplier. Therefore, while the follow description focusses primarily on frequency doublers, the description applies equally to the broader category of even harmonic multipliers. Due to the complimentary nature of the circuitry used in various embodiments of the present invention, the even harmonic current components add, while the odd harmonic current components cancel each other.

Voltage and Current Density Scaling

The following shows that supply voltage reduction (voltage scaling) and supply current density reduction (current density scaling) impact different frequency doubler device parameters. This orthogonality allows independent optimization of either small signal performance or linearity. Generally, voltage scaling degrades small signal linearity (the third order intercept or TOI), and large signal linearity (the 1 dB compression point or 1 dBCP). It has a weak effect on small signal performance (gain, bandwidth, and noise) until the supply voltage is too low to keep the frequency doubler in the saturation regime. However, current density scaling degrades all small signal parameters significantly but weakly impacts linearity. The orthogonality of the impact of voltage scaling and current density scaling enables power optimization under given performance and linearity constraints.

When considering current biasing, it is helpful to consider the total drain current normalized to channel width, which is proportional to the inversion coefficient (IC) defined as:

$$IC = \frac{I_D}{I_0 \frac{W}{L}} \propto \frac{I_D}{W}. \quad \text{(Eq. 1)}$$

The IC is based on the EKV transistor conduction current model, defined in Equations 2A and 2B, which specify the dependence of the drain current ($I_D$) on both the small signal gate ($v_g$) and drain ($v_d$) voltages. This feature enables the modeling of device transconductance ($g_m$) and output conductance ($g_{ds}$) and models the transition between saturation and triode.

$$I_D = I_{Forward} - I_{Reverse} = I_F - I_R, \text{ and} \quad \text{(Eq. 2A)}$$

$$I_D = I_0 W/L \left[ \ln\left(1 + \exp\left(\frac{v_p - v_s}{2V_T}\right)\right) \right]^2 - \left[ \ln\left(1 + \exp\left(\frac{v_p - v_d}{2V_T}\right)\right) \right]^2, \quad \text{(Eq. 2B)}$$

where $I_0$ is a technology constant, W and L are the device width and length, respectively, the pinch-off voltage $v_p \approx V_G/n - V_{TO}/n$ ($V_G$ is the DC gate voltage, n is the subthreshold slope, $V_{TO}$ is the threshold voltage), $V_T$ is the thermal voltage, and $v_s$ is the small signal source voltage. Equations 2A and 2B can be rewritten as:

$$I_F \approx I_0 W/L \left[ \ln\left(1 + \exp\left(\frac{-V_{TO}}{2nV_T}\right)\exp\left(\frac{v_g/n - v_s}{2V_T}\right)\right) \right]^2, \text{ and} \quad \text{(Eq. 3A)}$$

$$I_R \approx I_0 W/L \left[ \ln\left(1 + \exp\left(\frac{-V_{TO}}{2nV_T}\right)\exp\left(\frac{v_g/n - v_d}{2V_T}\right)\right) \right]^2. \quad \text{(Eq. 3B)}$$

Equations 3A and 3B emphasize the dependence of $I_D$ on the device voltages. In the common source configuration, the DC source voltage $V_S$ typically goes to zero, and the DC drain voltage $V_D$ scales down $I_R$, making it negligible compared to $I_F$. When $V_D$ is sufficiently small, $I_R$ is comparable to $I_F$, leading the frequency doubler to operate in soft saturation or triode mode. In the soft saturation mode, the frequency doubler can still present beneficial levels of RF gain at reduced power consumption.

A helpful metric for comparing the power efficiency of amplifiers is defined in Equation 4, which is the gain in dB ($Gain_{dB}$) divided by the DC power consumption ($P_{DC}$):

$$\text{Amplifier Efficiency} = \frac{Gain_{dB}}{P_{DC}} \quad \text{(Eq. 4)}$$

This parameter, termed the amplifier efficiency, is a practical metric when considering cascaded amplifiers, as amplifier gains multiply while their DC powers add in cascaded amplifiers. Examining simulated amplifier efficiency by normalizing maximum power gain $G_{Max}$ to DC power consumption, as illustrated in FIG. 1, shows that minimizing power consumption at a fixed gain level requires very low bias voltages ($V_D < 0.2V$). FIG. 1 illustrates simulated amplifier gain (in dB) normalized to power consumption, across varying device ICs and drain voltages $V_D$, showing the potential of aggressive supply bias scaling for power reduction compared to typical maximum voltage and optimum current density bias points.

FIG. 1 indicates that aggressive voltage scaling has the potential to reduce the DC power consumption for a given gain level drastically. Unfortunately, as discussed below, several other device parameters are degraded by scaling the supply voltage. Notably, the small gain levels achieved at the maximum power efficiency points necessitates multistage designs increasing the area and decreasing bandwidth. As illustrated in FIG. 1, the lowest supply voltage (80 mV) and lowest IC bias point (12.5 µA/µm) has a 50 times higher efficiency but at a 4× lower gain relative to a prior art bias point of 1 V and 200 µA/µm. Furthermore, as the supply voltage is scaled down, both the TOI and the 1 dBCP are substantially reduced.

Due to the orthogonality of scaling the supply voltage and the current density, the following describes how one may independently optimize small signal performance or linearity. Voltage scaling will be examined first, while current reuse and current density scaling will be examined second.

Voltage scaling is a powerful tool for power reduction in mmW systems. From a small signal perspective, voltage scaling appears to be a powerful tool for power reduction; however, this technique has several limitations. The two primary limitations of this technique are linearity reduction (both the TOI and the 1 dBCP), and triode mode operation degrading small signal parameters.

Figure 2A:
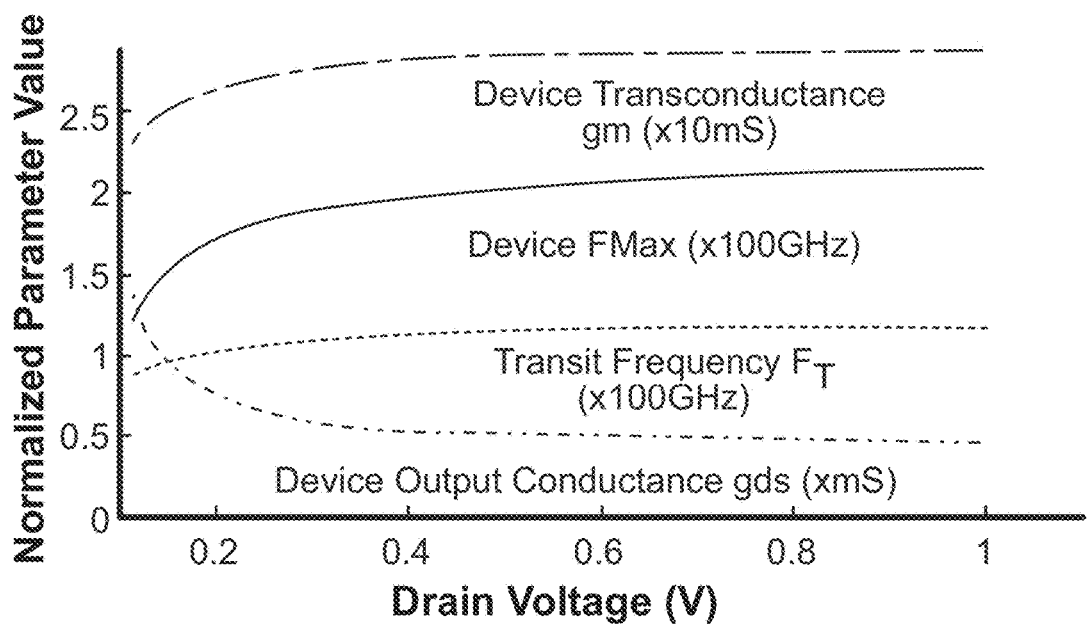
FIGS. 2A and 2B illustrate simulated amplifier small signal parameters as a function of drain voltage that may be used to guide the design of CCR frequency doublers in accordance with one or more embodiments of the present invention.
Figure 2B:
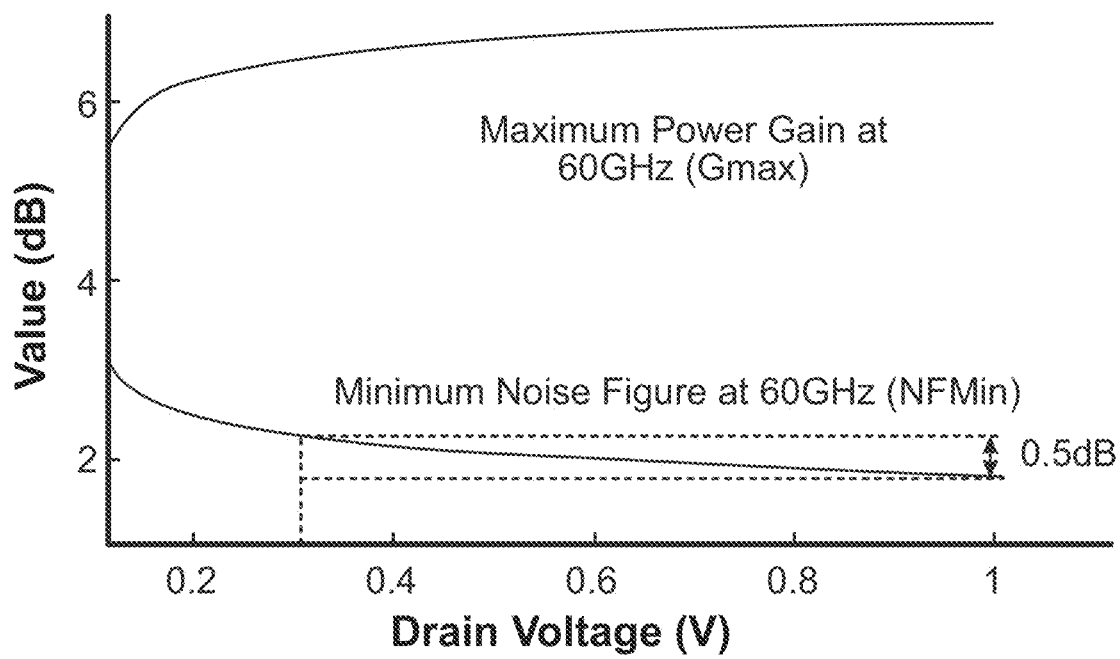

As the drain voltage is scaled down, transistors inevitably enter the triode mode regime, which presents primarily as an increase in the device's output conductance, reducing device self-gain. As $g_{ds}$ increases, the device self-gain begins to decrease as current is shunted away from the load, leading to a reduced gain and, consequently, $G_{Max}$ and the minimum noise figure $NF_{min}$. Examining the significant small signal amplifier parameters is instructive regarding this trade-off. FIGS. 2A and 2B illustrate simulation results on how the device's primary small signal parameters scale as a function of $V_D$ under a fixed IC=2, at a current density of 50 µA/µm, for an operating frequency of 60 GHz. These small signal parameters include $g_m$, $F_{max}$, the unity current gain frequency $F_T$, $g_{ds}$, $G_{Max}$, and $NF_{min}$. From a small signal perspective, device performance does not change appreciably until the drain voltage decreases and the device enters the triode regime. FIG. 2B illustrates a 0.4 dB decrease in $G_{Max}$ and a 0.5 dB decrease in minimum noise when the drain voltage decreases from 1V to 0.25V.

The impact of voltage scaling on linearity is more complex than on small signal parameters. Both $I_F$ and $I_R$ terms in Equations 3A and 3B, respectively, have the potential to generate intermodulation distortion. From Equations 5A and 5B, $v_d$ scales down the magnitude of the second term in the bracket, reducing $g_d''$ compared to $g_m''$.

Figure 3A:
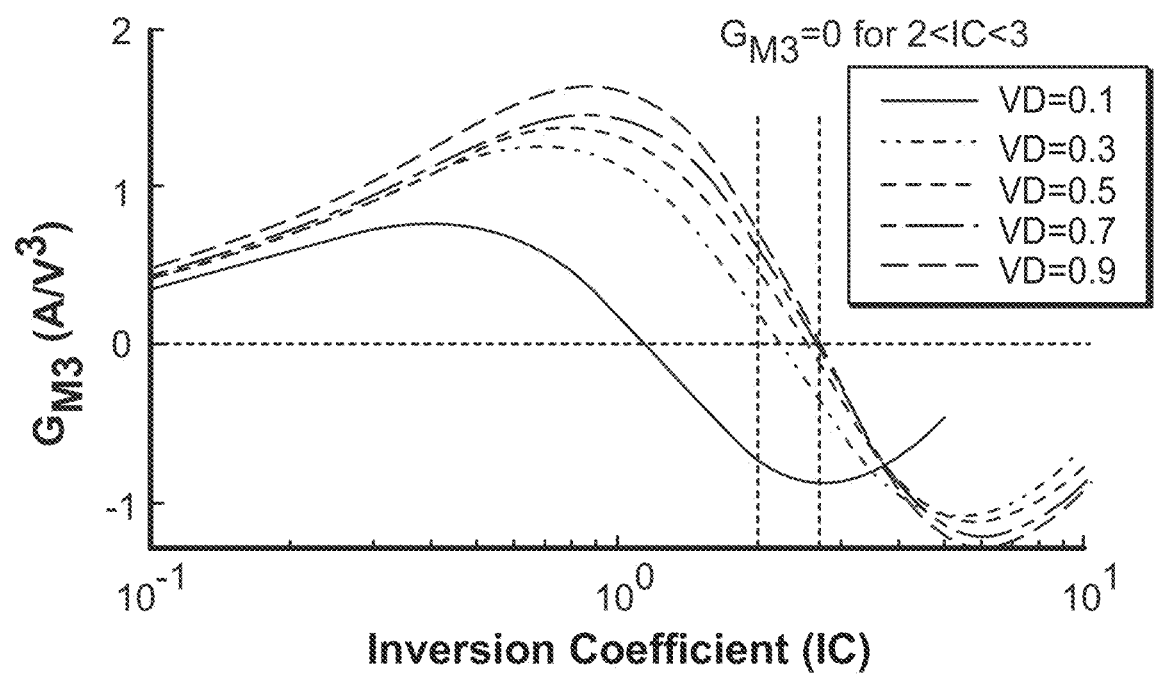
FIGS. 3A and 3B illustrate simulated gate and drain induced third order nonlinearities, respectively, as a function of the inversion coefficient that may be used to guide the design of CCR frequency doublers in accordance with one or more embodiments of the present invention.
Figure 3B:
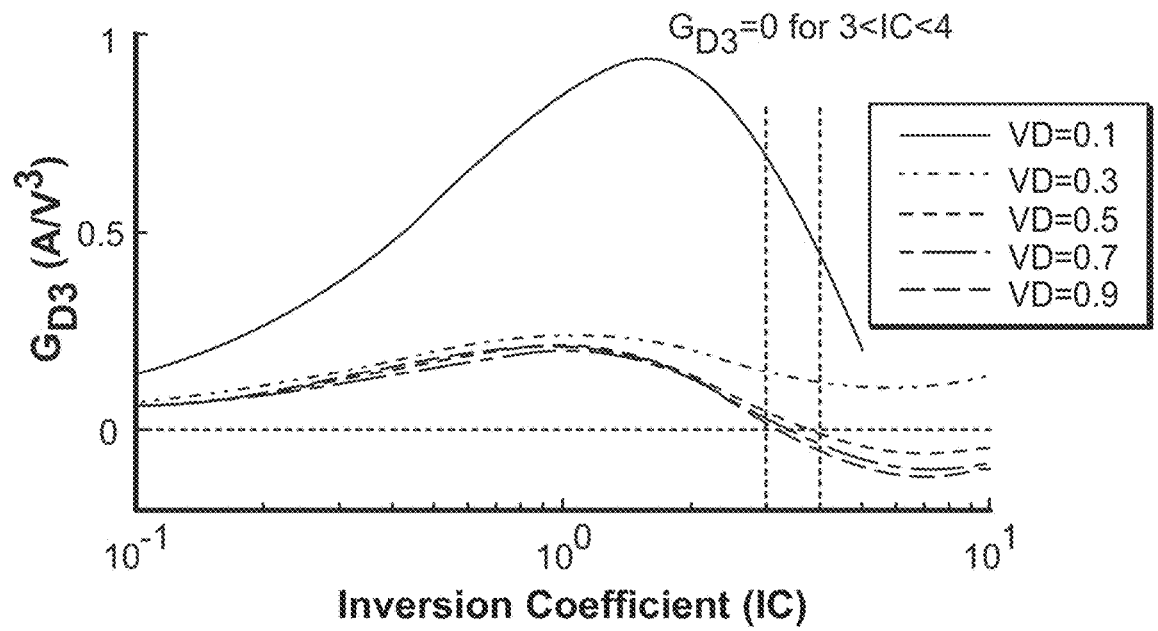

Nonlinearities become substantial when $v_d$ is near the edge of the triode region, where $V_{DS}<V_{DSSat}$. The edge of the saturation regime is defined by Equation 6. Equation 6 assumes $I_F>I_R$ and gives a range of $v_d$ between 110 mV and 245 mV for ICs varying from 0.1 to 10. Comparing the gate induced and drain induced third order nonlinearities $g_m''$ and $g_d''$, as illustrated in FIGS. 3A and 3B, respectively, shows that only for low $v_d$ is $g_d''$ Comparable to $g_m''$, except near the $g_m''$ sweet spot bias points, corresponding to ICs between 2 and 3. FIGS. 3A and 3B illustrate that for moderate $V_{DS}>0.3$ V, $g_m''$ is typically larger than $g_d'$.

$$I_F \approx \left[\ln\left(1 + k_0 \exp\left(\frac{v_g}{2nV_T}\right)\right)\right]^2, \quad \text{(Eq. 5A)}$$

$$I_R \approx \left[\ln\left(1 + k_0 \exp\left(\frac{-V_{D0}}{2V_T}\right)\exp\left(\frac{\frac{v_g}{n} - v_d}{2V_T}\right)\right)\right]^2, \text{ and} \quad \text{(Eq. 5B)}$$

$$V_{DSmin} = 2V_T\sqrt{IC + 0.25} + 3V_T, \quad \text{(Eq. 6)}$$

where $V_G=V_{G0}+v_g$, $V_S=0$ and $V_D=V_{D0}+v_d$, with the quiescent gate voltage $V_{G0}$ and the quiescent drain voltage $V_{D0}$ representing DC bias points, and $v_g$ and $v_d$ are small signal voltages. $k_0$ accounts for the DC gate voltage $V_G$ and the threshold and scales both $I_F$ and $I_R$. Equations 5A, 5B, and 6 are functions of $v_g$ and $v_d$. Examining the impact of these voltage levels on the current for small excursions around a fixed bias point via a two-dimensional Taylor series, as in Equations 7A and 7B, allows one to compare the impact of voltage scaling on the relative strengths of the harmonic current generated.

$$I_F(V_{G0} + V_g) = I_F(V_{G0}) + g_m V_g + g_m' V_g^2 + g_m'' V_g^3 + \ldots, \text{ and} \quad \text{(Eq. 7A)}$$

$$I_R(V_{G0} + V_g, V_{D0} + V_d) = I_R(V_{G0}, V_{D0}) + g_{mR} V_g + g_{m2}' V_g^2 + \quad \text{(Eq. 7B)}$$
$$g_{mR}'' V_g^3 + g_d V_d + g_{d2}' V_d^3 + g_{md} V_g V_d + g_{m'd} V_g^2 V_d + g_{md'} V_g V_d^2 + \ldots,$$

where the partial derivatives are evaluated at $V_{G0}$ and $V_{D0}$, $g_{mR}$ is the derivative of $I_R$ with respect to $v_g$, and $g_{md}$ is the partial derivative of $I_R$ with respect to $v_d$. At the same time, $g_{mvd}$ is the second derivative of $I_R$ with respect to $v_g$ and the first derivative with respect to $v_d$ as calculated from the standard definition for evaluating the multidimensional Taylor series.

Focusing on the terms that generate third-order nonlinearities (Equations 8A and 8B) enables a comparison of the third-order nonlinearities generated by $I_F$ and $I_R$. Assume the small signal value of $v_d$ is $v_d=-A_v v_g$, see Equation (9), where $A_v$ is the small signal voltage gain across the device drain.

$$I_{F3rd} = g_m'' V_g^3, \text{ and} \quad \text{(Eq. 8A)}$$

$$I_{R3rd} = g_{mR}'' V_g^3 + g_d'' V_d^3 + g_{m'd} V_g^2 V_d + g_{md'} V_g V_d^2. \quad \text{(Eq. 8B)}$$

$$I_{R3rd} = g_{mR}'' V_g^3 - g_d'' A_v^3 V_g^3 - g_{m'd} A_v V_g^3 + g_{md'} A_v^2 V_g^3. \quad \text{(Eq. 9)}$$

Figure 4:
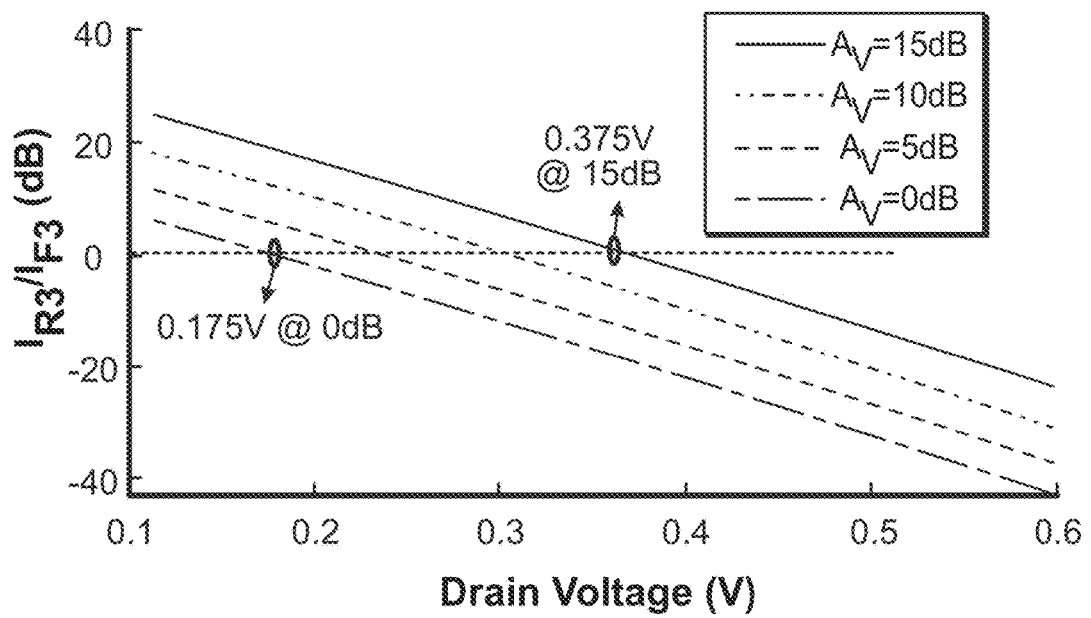
FIG. 4 illustrates simulated reverse to forward third order current ratios as a function of drain voltage that may be used to guide the design of CCR frequency doublers in accordance with one or more embodiments of the present invention.

In this case, one can compare the third-order current generated by $I_R$ for a small input to the $I_F$ as a function of $V_{D0}$, a simulation of which is illustrated in FIG. 4. This simulation employed a common source configuration and a bias of $V_{GS}-V_T H=0.1$ V. Even for voltages where $V_{DS}>V_{DSSat}$, the nonlinearity of $I_R$ can be significant and dominate the nonlinearity of $I_F$. The higher voltage swing levels at the drain generate strong nonlinear contributions, strengthening the impact of $I_R$ on the TOI. These high voltage levels offset the higher value of $g_{m3}$ compared to $g_{ds3}$ (derivates of current with respect to gate source and drain source voltages).

Figure 5A:
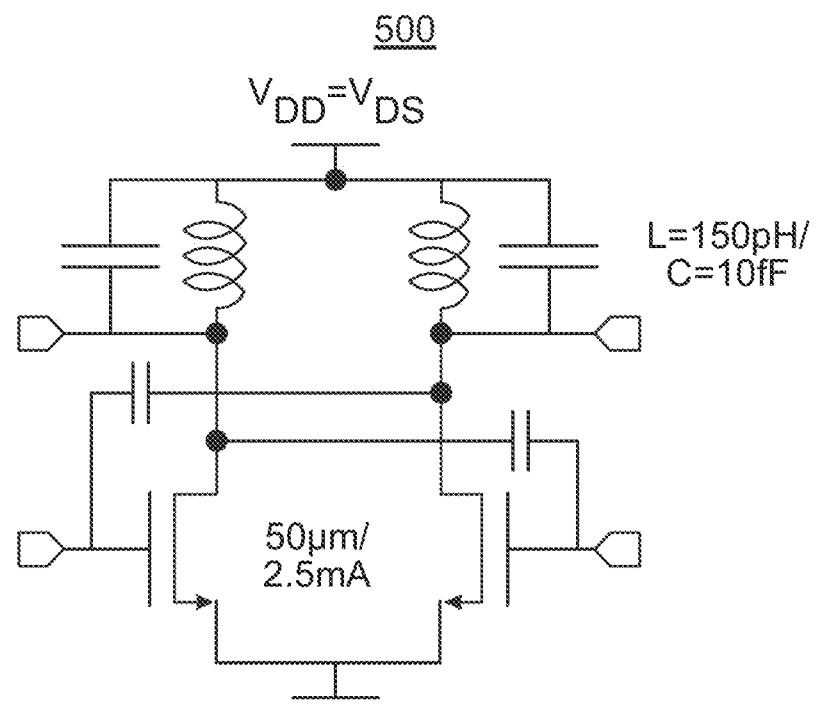
FIGS. 5A and 5B illustrate a circuit schematic of a prior art amplifier and its simulated small signal parameters as a function of drain voltage, respectively.

FIG. 5A illustrates a prior art amplifier 500, which gives valuable insight into how linearity and gain scale with decreased supply voltage. The amplifier 500 is biased for IC=2 and an operating frequency of 60 GHz. The amplifier 500 includes matching tank inductors in parallel with corresponding matching tank capacitors. The amplifier 500 further includes matching coupling capacitors. Lastly, amplifier 500 includes matching MOSFETs in an inductively-loaded, neutralized common source configuration.

Figure 5B:
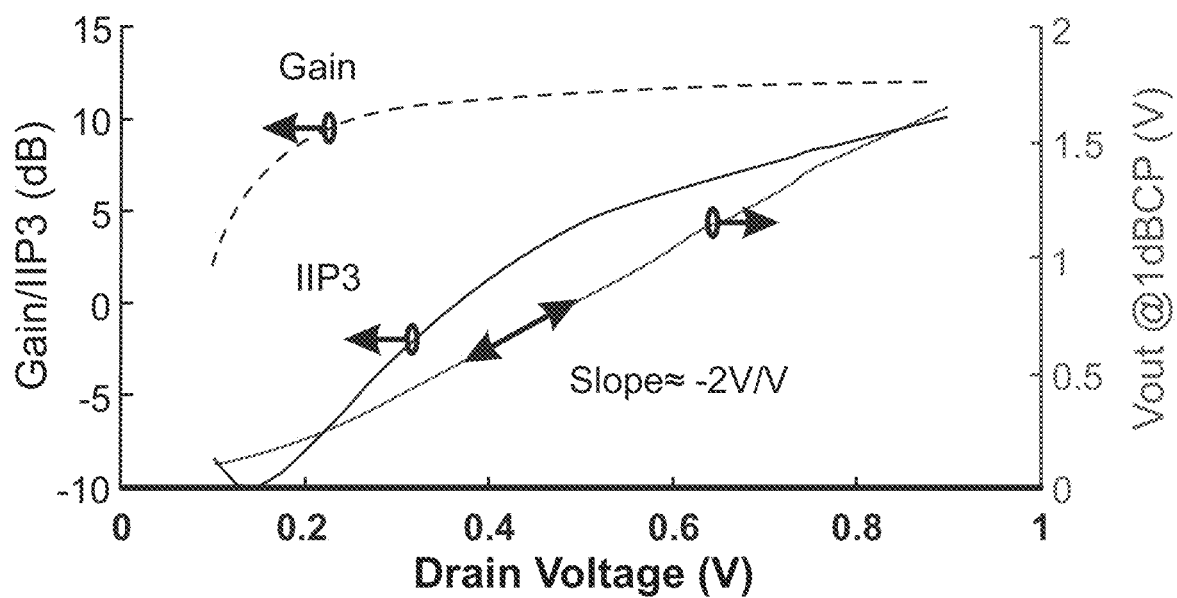

As illustrated in FIG. 5B, the simulated gain of the amplifier 500 rolls off faster with reduced supply voltage than the single FET $G_{max}$ illustrated in FIG. 4. At the same time, the 1 dBCP scales down linearly with $V_D$ with a slope of roughly −2V/V, due to the differential nature of the circuit. Compression of the 1 dBCP occurs when a significant input signal forces the amplifier 500 into triode mode. The output voltage swing level the amplifier 500 can support is primarily a function of $V_D$ and the current bias point, which leads to nearly a one-to-one degradation between the 1 dBCP and $V_D$. Examining the TOI across decreasing $V_D$ shows moderate degradation for limited voltage scaling ($V_D>0.4$ V) and significant degradation at low values of $V_D$. The TOI degrades rapidly with voltage scaling, even for instances where $I_F$ is much greater than $I_R$.

The supply voltage level where drain nonlinearity $g_{d3}''$ (third derivative of current with respect to drain source current) begins to significantly impact the TOI is higher than the value predicted by the transistor $V_{DSSat}$, which is 0.15 V for a transistor biased with an IC=2. In the example configuration of the amplifier 500, the $V_{DG}$ swing is much larger than the $V_{GS}$ swing due to the voltage gain across the amplifier 500. Higher voltage levels across the drain-gate terminals increase the impact of drain nonlinearities on supply voltage levels, where the simulated results illustrated in FIG. 3B would indicate they are insignificant. This exemplary amplifier 500 illustrates how the 1 dBCP degrades nearly linearly with decreased supply voltage, while the TOI scaling is more complicated. In contrast, moderate voltage scaling has a weak impact on the TOI, while voltage scaling strengthens drain-induced nonlinearity, which becomes dominant as $V_{DS}$ is reduced. These results indicate that moderate voltage scaling, for example, $V_{DS} \approx V_{DSSat}$, has a weak impact on small signal performance but degrades linearity, necessitating a tradeoff between power and linearity.

Complementary Current Reuse

Figure 6A:
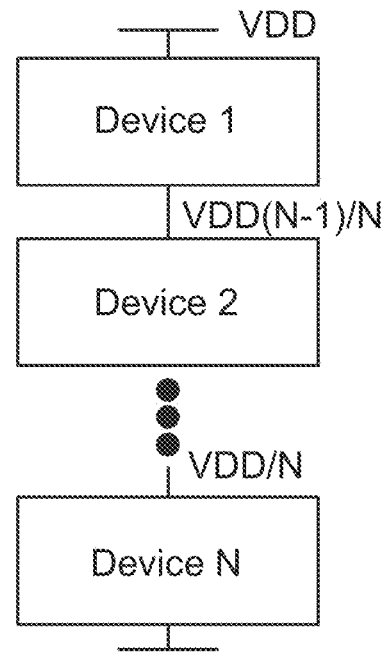
FIGS. 6A-6C illustrate circuit schematics of first, second, and third current reuse circuit topologies, respectively, that may be used for CCR frequency doublers in accordance with one or more embodiments of the present invention.

Current reuse is a form of voltage scaling where a high voltage supply is split into multiple sub-domains. Current reuse enables multiple blocks to share the same supply current, as illustrated in FIG. 6A. Current reuse allows the use of a single system supply voltage while employing voltage scaling for power reduction. This technique reduces the component overhead by removing the need for additional regulators and decreasing power consumption as regulators consume power and have limited conversion efficiency. In addition, high-efficiency regulators, which are required for direct voltage scaling, require switch-mode power supplies that can modulate the RF signal, creating spurious tones.

Figure 6B:
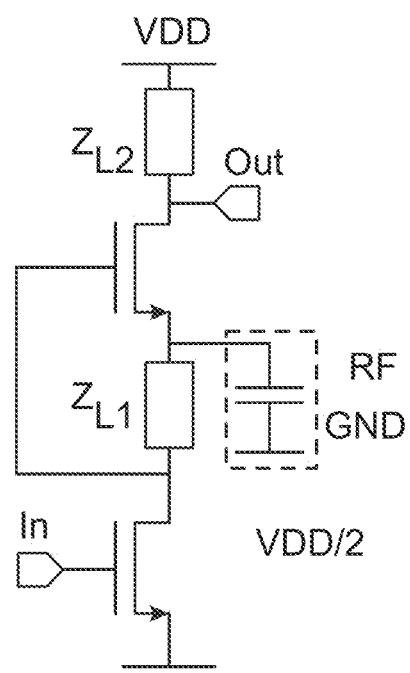
Figure 6C:
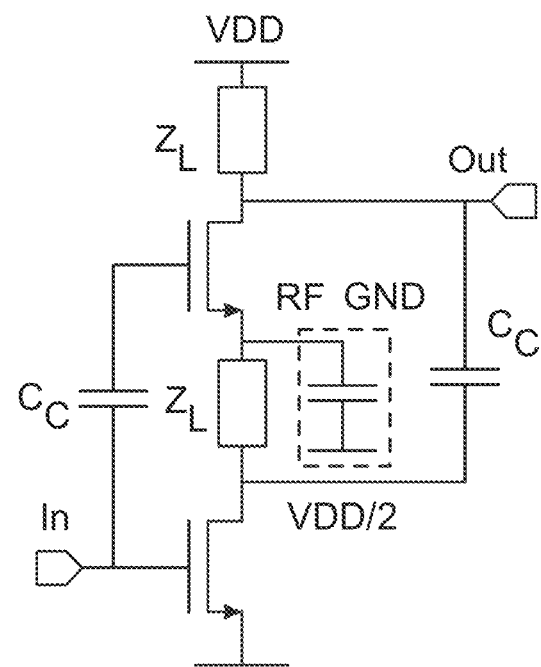

There are two basic methods of realizing current reuse, cascading blocks that share the same voltage supply, as illustrated in FIG. 6B, and dividing a transconductor into several parallel transconductors which share the same voltage supply rail, as illustrated in FIG. 6C. Equation 10 indicates how power savings are accomplished for transconductor current reuse topology (FIG. 6C) as several devices act as a composite transconductor. In the cascaded current reuse topology (FIG. 6B), different stages share the same bias current and support differing signal swings. With transconductor current reuse, each stage can have an independent bias current while every stage sharing the voltage rail has comparable signal levels. These two current reuse topologies provide similar amplifier efficiency and power savings.

$$G_{mEff.} \approx \sum_{n=1}^{N} G_{mn} = NG_{m1} \quad \text{(Eq. 10)}$$

A significant issue with cascaded current reuse is that later stages typically experience significantly larger signal swings. DC offsets generated by device second order nonlinearity are much more significant for later stages than earlier ones. These DC offsets are coupled into earlier stages through the shared current. Comparing amplifier linearity between differential implementations of the circuit designs illustrated in FIG. 7A (current reuse) and FIG. 5A (non-current reuse) for equivalent device drain voltages $V_{DS}$ offers similar TOI performance. At the same time, the 1 dBCP is substantially reduced in the cascaded current reuse design (>5 dB for inductively loaded devices). This example illustrates a significant advantage of the transconductor current reuse topology (FIG. 6C) compared to the cascaded current reuse topology (FIG. 6B).

Figure 7A:
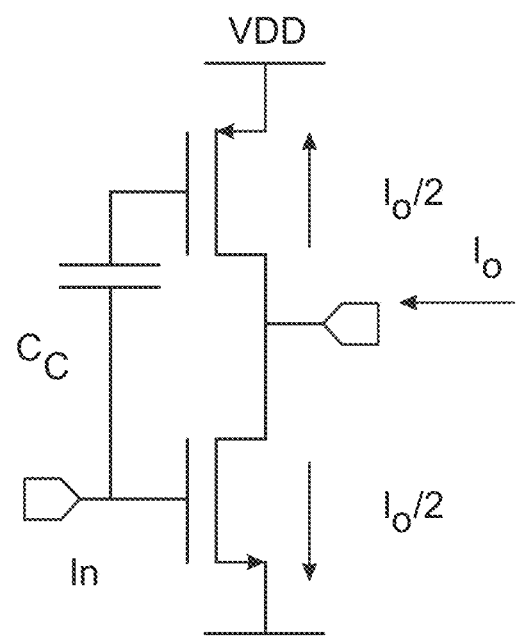
FIGS. 7A-7C illustrate a circuit schematic of a current reuse circuit topology, the first and second order currents, and simulated small signal parameters as a function of the inversion coefficient, respectively, that may be used for CCR frequency doublers in accordance with one or more embodiments of the present invention.
Figure 7B:
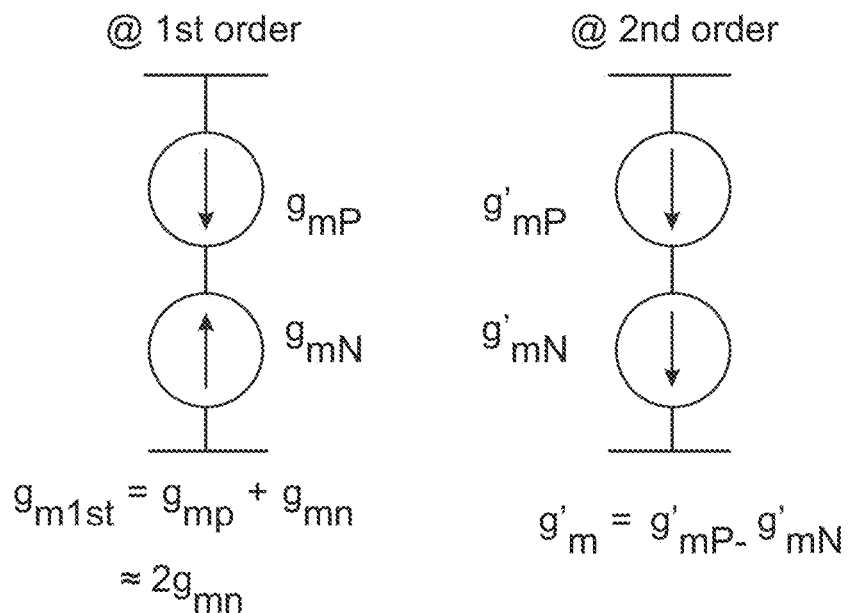

Complementary current reuse (CCR), as illustrated in the circuit of FIG. 7A, is a particular topology for current reuse where NMOS and PMOS devices are sized for substantially equivalent transconductance and share the same supply current. CCR has several advantages compared to traditional current reuse techniques. Due to the complementary nature of the CCR topology, no large AC grounding capacitance is needed to ensure an AC ground between the transconductors. The CCR topology illustrated in FIG. 7A also inherently cancels second-order nonlinearity, drastically improving second order nonlinearity performance. FIG. 7B illustrates the first and second order currents for the CCR topology illustrated in FIG. 7A. While this topology does have advantages, it does not naturally lend itself to aggressive voltage scaling as it scales the effective supply voltage by only a factor of two.

Figure 7C:
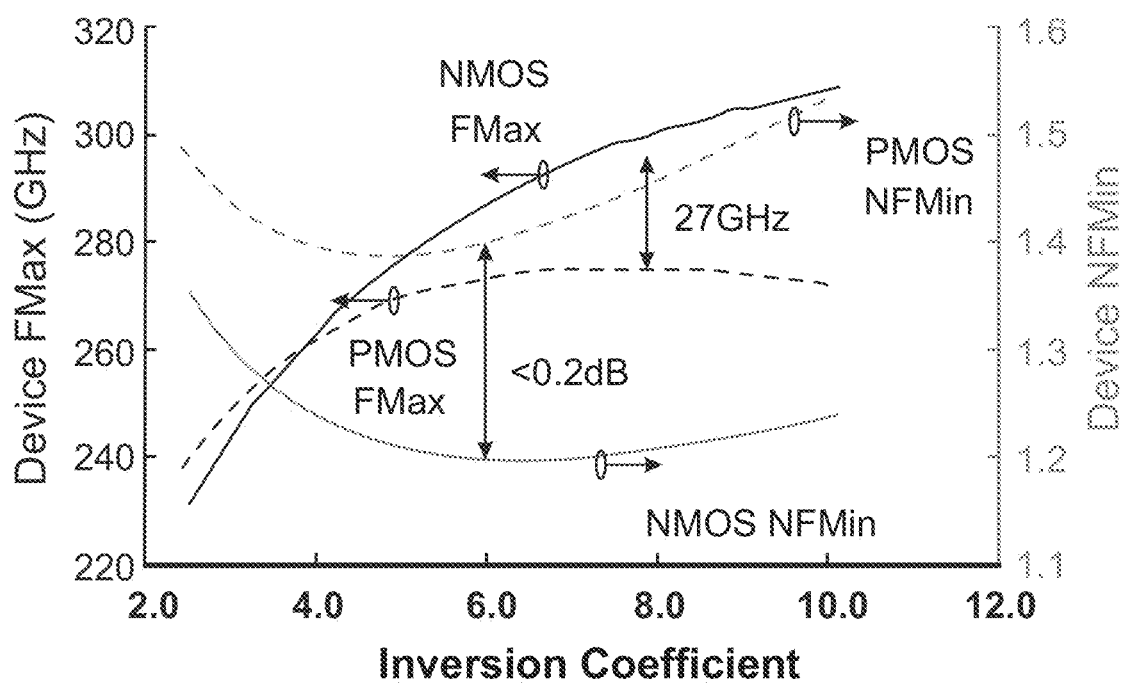

A significant weakness in the CCR technique for millimeter-wave (mmW) design is that the RF PMOS device needs to be very high-performance. In older bulk CMOS nodes, NMOS device performance was typically much higher than PMOS device performance, leading to substantially degraded $F_{max}$ and $NF_{min}$ for PMOS devices. This asymmetry is one primary reason CCR has been a prevalent technique in lower frequency, low power design, but not in the mmW domain. Fortunately, several modern CMOS nodes enable very high-performance CMOS devices, such as the SOI node utilized in the design of FIG. 7A. PMOS device performance in this node compared to NMOS device performance is illustrated in FIG. 7C, and demonstrates performance on par with the NMOS device, enabling the adoption of CCR.

Various embodiments of the present invention employ the moderate voltage scaling enabled by CCR to, for example, scale a 1.0 V supply voltage in half. The reduced supply voltage moderately degrades the TOI and the 1 dBCP (see FIG. 5B), while providing inherent second order nonlinearity cancellation and allows for a very compact topology (see FIG. 7A) without the use of large AC coupling capacitors.

Figure 8A:
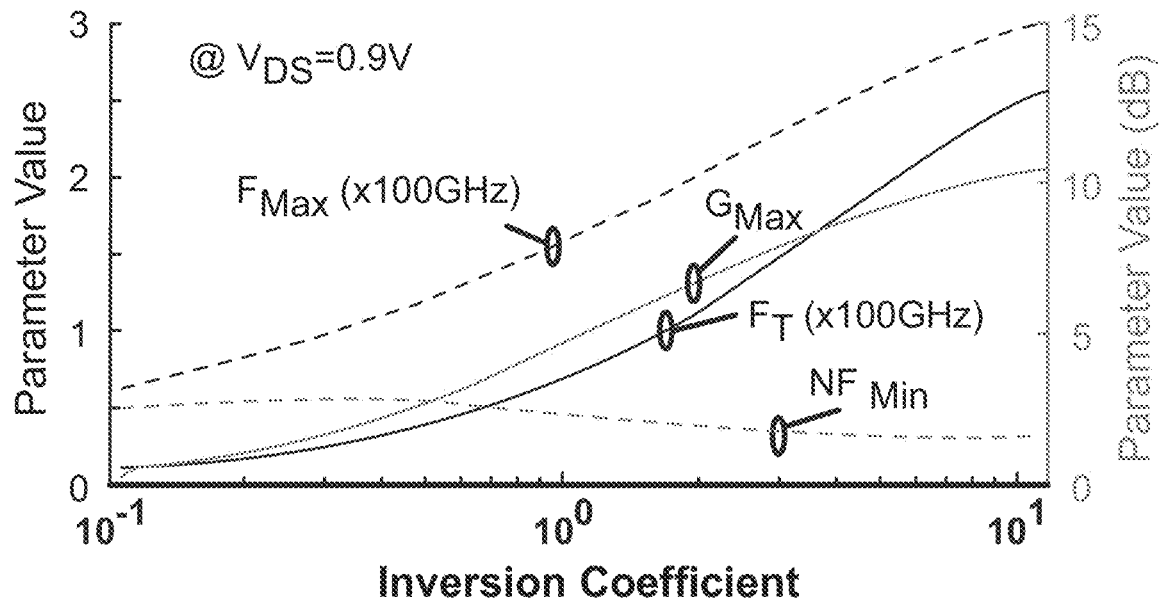
FIGS. 8A and 8B illustrate simulated small signal parameters as a function of the inversion coefficient that may be used to guide the design of CCR frequency doublers in accordance with one or more embodiments of the present invention.
Figure 8B:
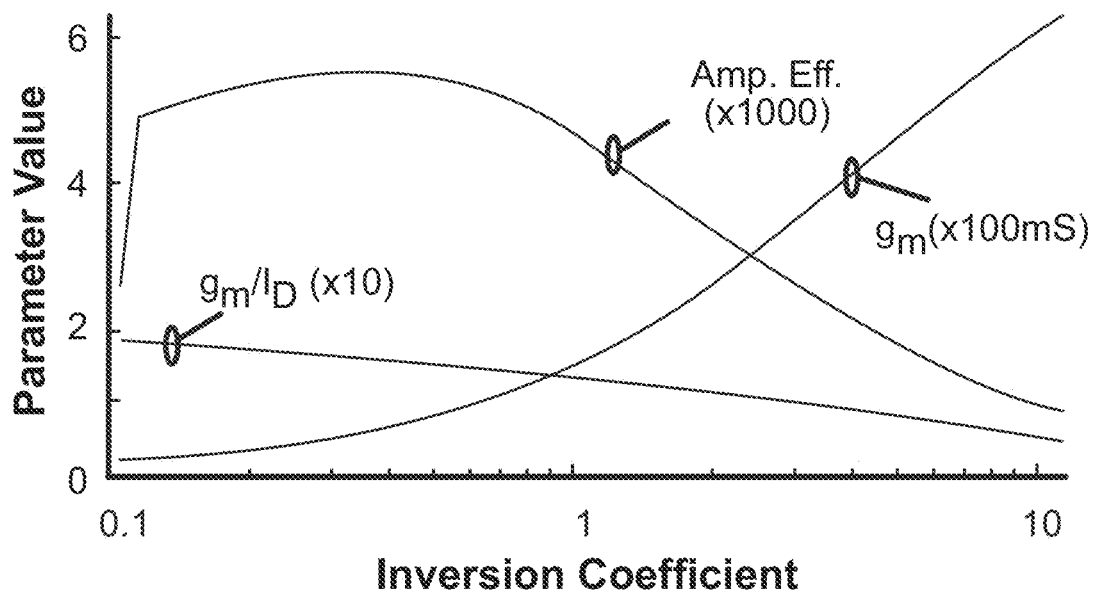

Following the same procedure for current density scaling as used for voltage scaling as described above, the impact on small signal parameters is examined, followed by the effects on large signal parameters. Sweeping the IC and examining small signal performance, as illustrated in FIG. 8A, shows that most small signal parameters monotonically improve with increasing IC. For example, $F_{max}$, $F_T$, and $NF_{min}$ all find their optimum values at high ICs. While $g_m$ peaks at high ICs, $g_m$ normalized to $I_D$, i.e., $g_m/I_D$, shows that low current densities are optimum, as illustrated in FIG. 8B. This result indicates a trade-off between device performance and power consumption. While most parameters are degraded for low ICs, an RF NMOS device at IC=2 yields $F_{max}$=208 GHz, $G_{Max}$=6.9 dB, and $NF_{min}$=1.9 dB at an operating frequency of 60 GHz, which enables high levels of RF performance at low power.

FIG. 8B also illustrates that a low current density increases the transconductance per unit current ($g_m/I_D$). However, it decreases transconductance per unit width ($g_m/W$). This trade-off is well known in the low-power literature and is typically examined in the baseband amplifier context. For a device requiring a fixed $g_m$, it is instructive to look at performance from both a power and an output impedance perspective. Matching network bandwidth and the Q-factor have a well-known relationship. Generally, lowering the Q-factor leads to wider bandwidths. Biasing a device for $g_m$=1 while scaling width and current, as illustrated in FIG.

Figure 9A:
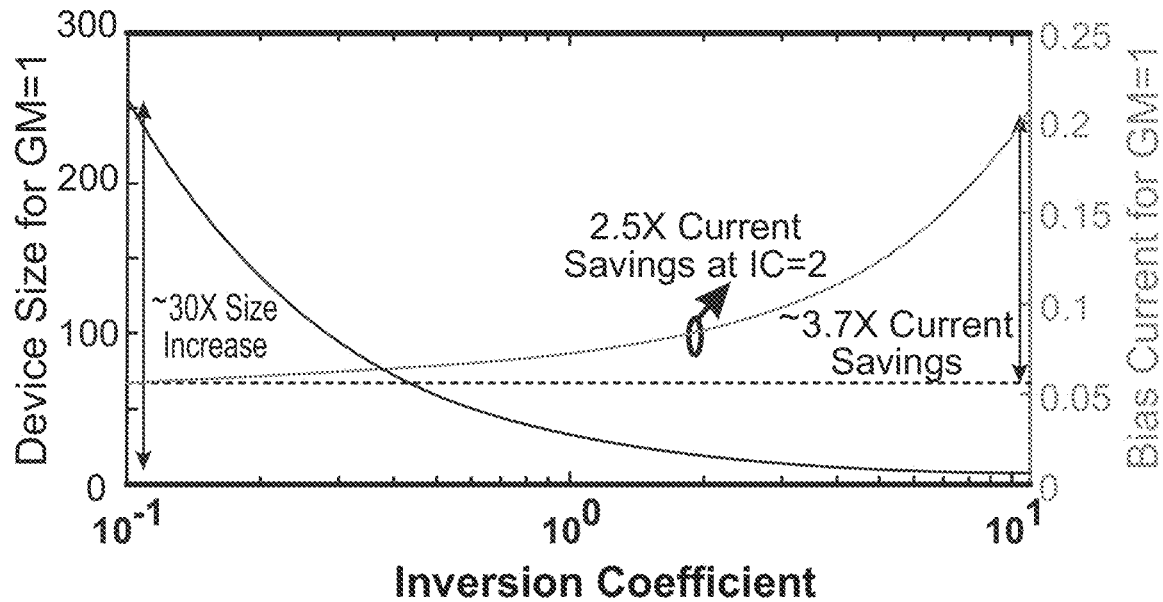
FIGS. 9A and 9B illustrate simulated device parameters as a function of the inversion coefficient that may be used to guide the design of CCR frequency doublers in accordance with one or more embodiments of the present invention.
Figure 9B:
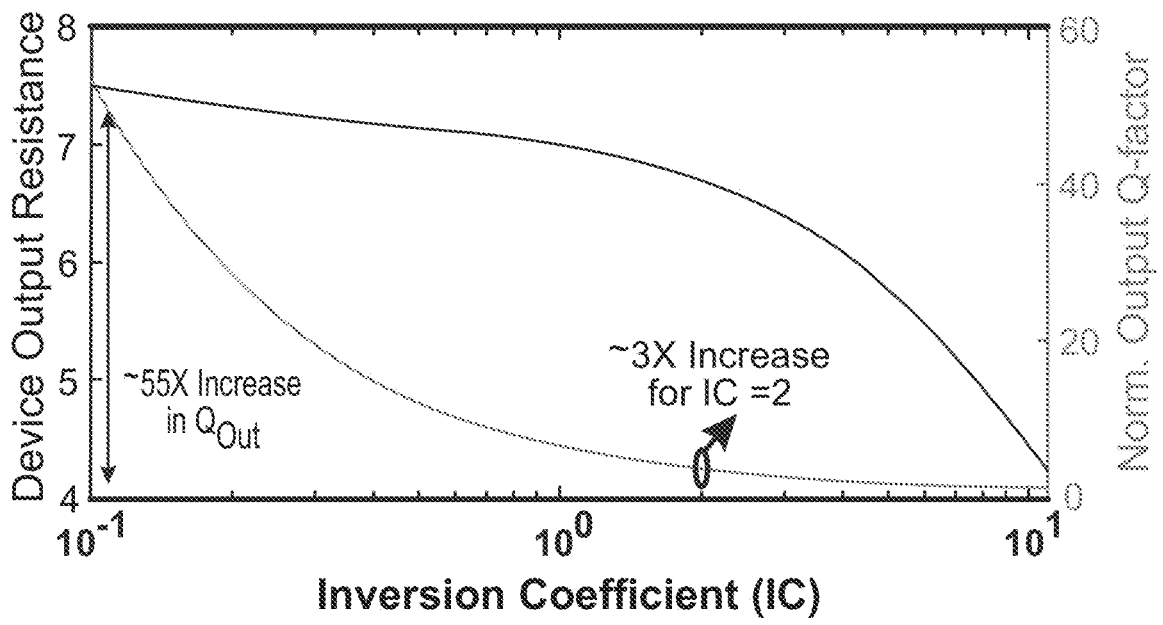

9A, shows that a 3.7× decrease in power consumption requires the device size to be increased by 30. As the device is scaled in size, the parasitic capacitance scales by the same factor. Examining the Q-factor for IC=10 and IC=0.1, as illustrated in FIG. 9B, shows a factor of 55 increase in the Q-factor for a power savings of less than 4×. To optimize bandwidth, employing moderate current density scaling utilizing an IC between 1 and 2 produces a power savings of 2.5× for a moderate Q-factor degradation of 3. The rapid performance degradation for bias points below IC=1 arises due to the device $g_m=I_D$ saturation as the device enters weak inversion and $F_{max}$ approaches the operating frequency of 60 GHz.

The impact of current density scaling on signal linearity is less pronounced compared to that of voltage scaling. This impact is notably reduced when considering high-impedance interfaces, which are common in on-chip environments. FIG. 3A illustrates the effect of current density scaling on gate-induced nonlinearity for varying drain voltages. Minimum $g_m^3$ (third derivative of current with respect to gate source voltage) occurs at lower ICs than are typically used in mmW design. Typically, these bias points also result in a high second-order nonlinearity. The high second-order nonlinearity is suppressed using CCR. The result is that lower IC biasing can improve the TOI in many situations.

Figure 10:
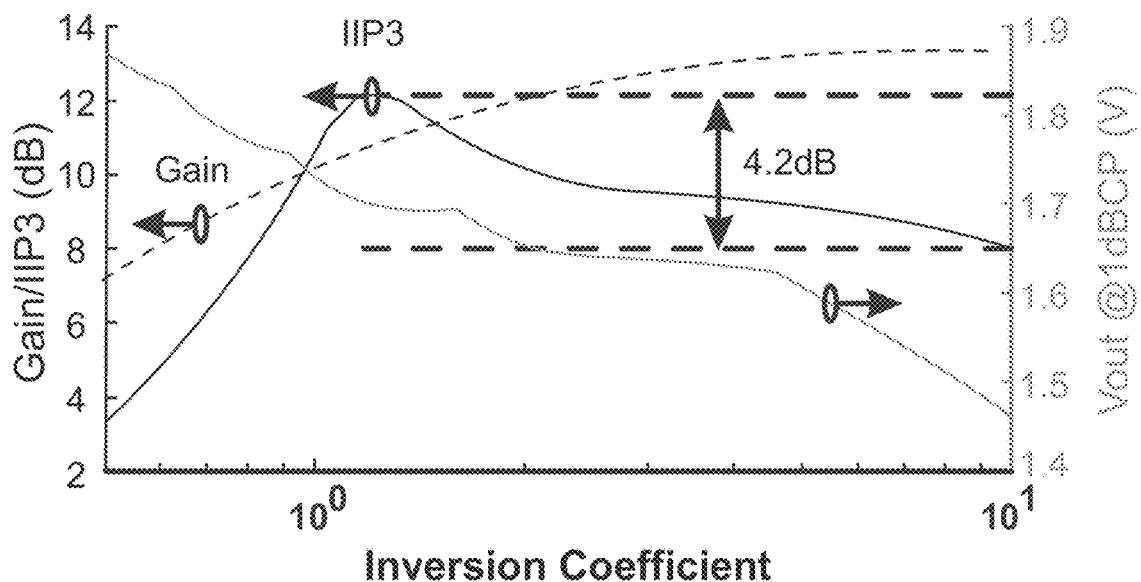
FIG. 10 illustrates simulated device nonlinearities as a function of the inversion coefficient that may be used to guide the design of CCR frequency doublers in accordance with one or more embodiments of the present invention.

Examining linearity for the same inductively loaded supply voltage and current density capacitively neutralized common source amplifier 500 illustrated in FIG. 5A, the amplifier TOI and 1 dBCP, illustrated in FIG. 10, show different behaviors for current scaling compared to voltage scaling. As the IC of the amplifier 500 increases and approaches the TOI minima, the TOI improves before decreasing at higher ICs showing a 4.2 dB improvement compared to typical mmW bias points. The simulations illustrated in FIG. 10 set the supply voltage $V_{DD}$=0.9 V.

The 1 dBCP, assuming a high impedance load, is weakly impacted by current scaling as compression is dictated by the device entering the triode region and compressing gain. The 1 dBCP varies from 1.75 V to 1.45 V as the IC varies between 1 and 10, as illustrated in FIG. 10. While for high impedance loads, dependence on bias current density is weak, in low impedance loads, the 1 dBCP degrades rapidly with current scaling, as is commonly observed in amplifier load-line analysis.

From a small signal perspective, nearly all linear device parameters degrade as bias current density decreases, and all rapidly degrade as $F_{max}$ approaches the operating frequency. From a large signal perspective, current scaling either has a weak impact on linearity with respect to the 1 dBCP or finds an optimum near the TOI sweet spot (IC≈1), which occurs at current densities lower than typical mmW bias points. The impact of current scaling is very different compared to voltage scaling, as current scaling has a substantial impact on small signal parameters and only a weak effect on linearity. Voltage scaling has a weak influence on small signal parameters, as long as $V_{DS}>V_{DSSat}$ but has substantial impacts on both the TOI and the 1 dBCP. This orthogonality between voltage and current scaling enables judicious power tradeoffs in both the large signal and small signal domains, enabling optimization toward system requirements.

Receiver Design

Figure 11A:
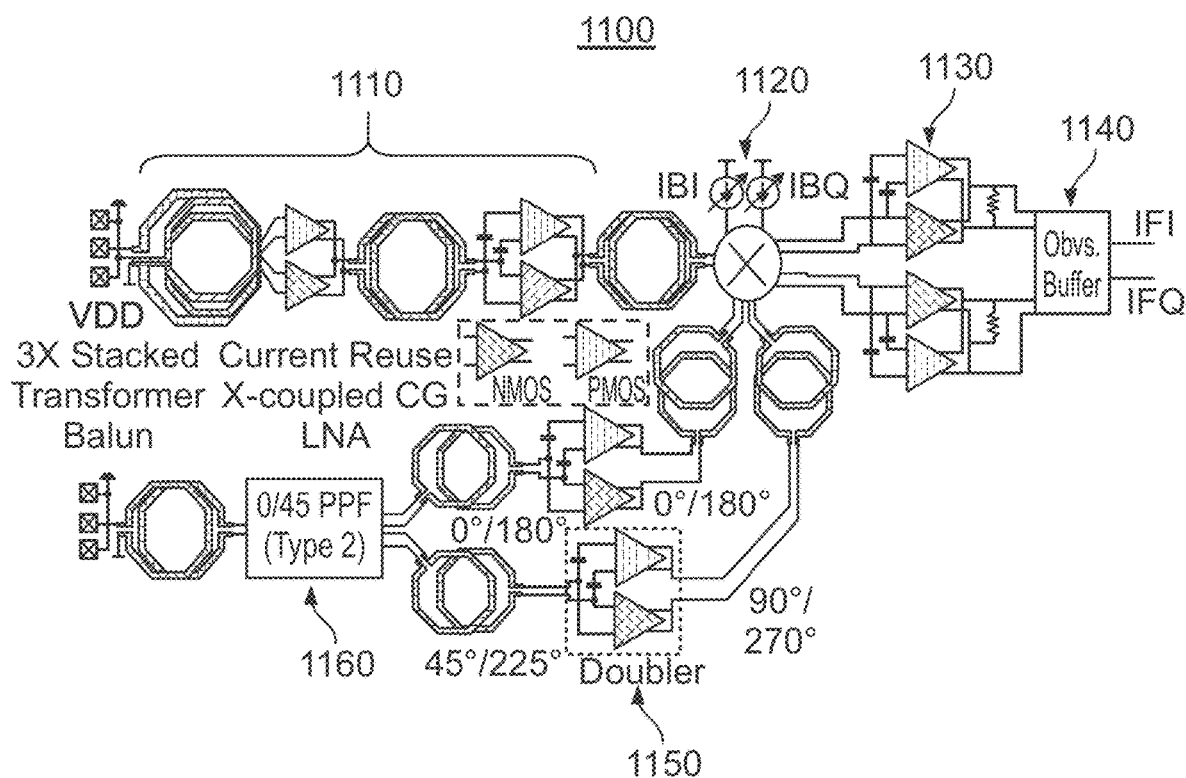
FIGS. 11A and 11B illustrate a block diagram and a die photograph of a receiver incorporating CCR frequency doublers in accordance with one or more embodiments of the present invention.
Figure 11B:
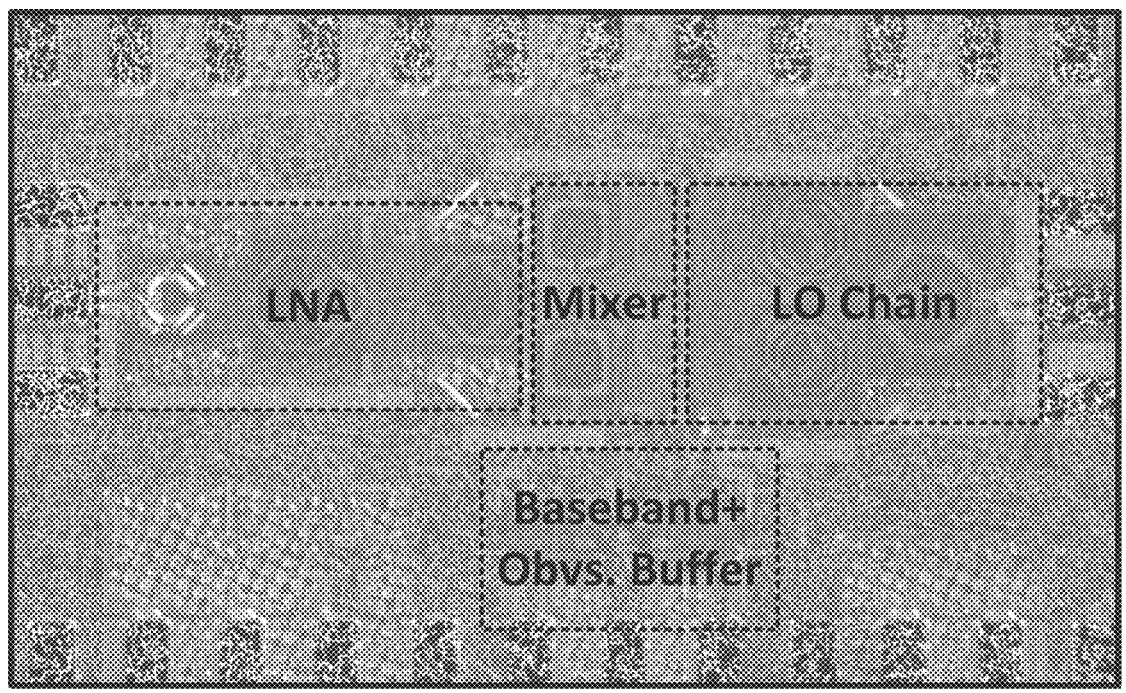

The receiver 1100, illustrated in FIG. 11A, which employs CCR frequency doublers 1150 in accordance with one or more embodiments of the present invention, targets low power consumption, while operating in the V-band utilizing the voltage and current density scaling strategies described above. A die photo of the receiver 1100 is illustrated in FIG. 11B, showing major system components The receiver 1100 utilizes a two-stage RF low noise amplifier (LNA) 1110 exploiting CCR, a quadrature gilbert cell mixer 1120, followed by a pair of baseband LNA 1130, and an output buffer 1140, all using ICs of less than 2 (45 µA/µm). The mixer 1120 is driven by a pair of CCR frequency doublers 1150 driven by a type-2 polyphase filter (PPF) 1160 generating 0° and 45° phase-shifted oscillator signals, which are doubled into 0° and 90° phase-shifted oscillator signals. By combining limited voltage scaling, for example, $V_{DS}$>0.4 V, to preserve linearity and moderate current density scaling, the receiver 1100 achieves excellent power consumption, bandwidth, and good linearity performance. Note that in some embodiments, the CCR frequency doublers may be replaced by CCR even harmonic multipliers operating at $2nF_0$. In these embodiments, the PPF 1160 will generate 0° and corresponding offset angle phase-shifted oscillator signals, where the magnitude of the corresponding offset angle is a function of which even harmonic multiple, i.e., 2n, is being generated by the CCR even harmonic multipliers. By way of example, and not limitation, if n=2, then the corresponding offset angle is 90°/2n=90°/4=22.5°.

Figure 12A:
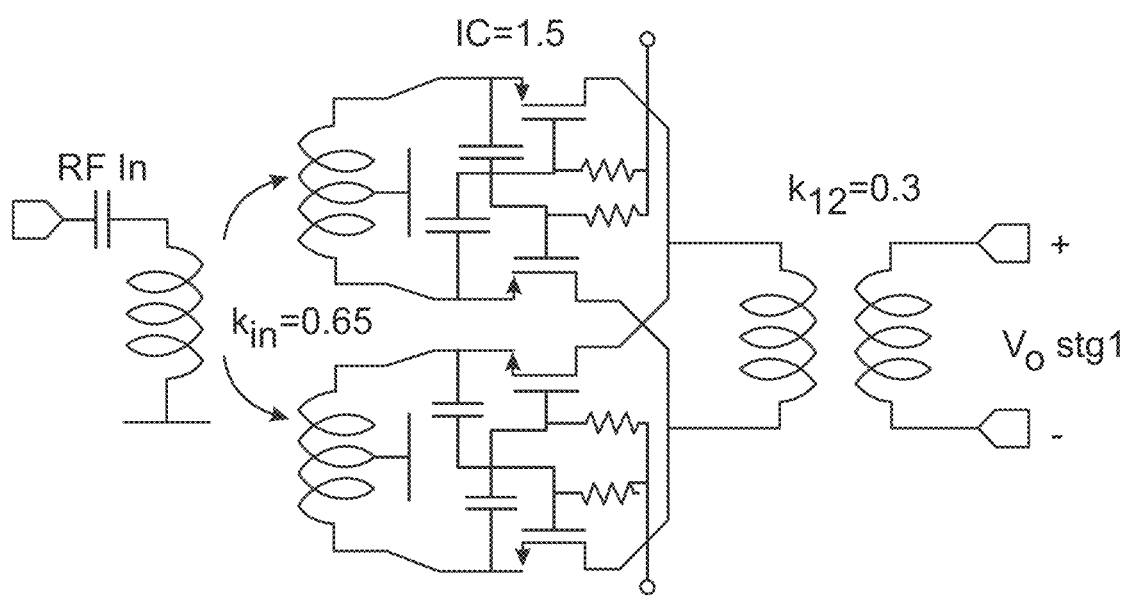
FIGS. 12A and 12B illustrate circuit schematics and FIG. 12C illustrates the simulated gain for a low noise amplifier that may be used as part of a receiver that incorporates CCR frequency doublers in accordance with one or more embodiments of the present invention.

The RF LNA 1110 consists of a two-stage design, utilizing CCR, fourth-order interstage coupling networks, and capacitive neutralization for stability improvement. The first LNA stage of the RF LNA 1110 is optimized for wideband impedance matching and low-noise figures. To achieve wideband input impedance matching while maintaining low power consumption, a CCR common gate RF LNA 1200 with differential $g_m$ boosting is used, as illustrated in FIG. 12A. The RF LNA stages are biased at IC=2.4 (52 µA/µm), which enables low noise. The transistors are sized for minimum gate length to optimize the $NF_{min}$. All transistors are biased for a minimum $V_D$ of 450 mV to minimize the impact of drain-induced non-linearity.

Low power bias points generally increase the overall impedances in the network, making wideband operation difficult. The chosen IC determines the Q-factor of the transistor output impedance, while the output impedance value is determined by both IC and transistor size (total bias current). To achieve a wideband operation on the input and outputs, I/O impedance and Q-factors need to be reduced. While differential $g_m$ boosting on the input reduces the input impedance significantly, it does not improve the output impedance. CCR effectively doubles the $g_m$ and halves the output impedance enabling wideband impedance matching.

The CCR common gate RF LNA 1200 includes a triple transformer design that enables CCR on the input. Specifically, the center-tapped secondaries in the triple transformer conduct bias current, and capacitive feedforward enables $g_m$ boosting. Wide bandwidth is obtained through an asymmetric transformer-based output coupling network, where $L_p≈2L_s$ (primary and secondary inductances) and k≈0.3, as necessitated by the high output impedance of the low-power common gate stage. When using fourth-order coupling networks, it is important to recall that the transimpedance $Z_{21}$ does not equal the input impedance $Z_{11}$, as illustrated in FIG. 12C. $Z_{11}$ of the output coupling network determines the voltage swing levels at the output of the transistor and the nonlinearity generated by the device. In contrast, $Z_{21}$ determines the gain of the network, thereby decoupling gain and linearity.

Figure 12B:
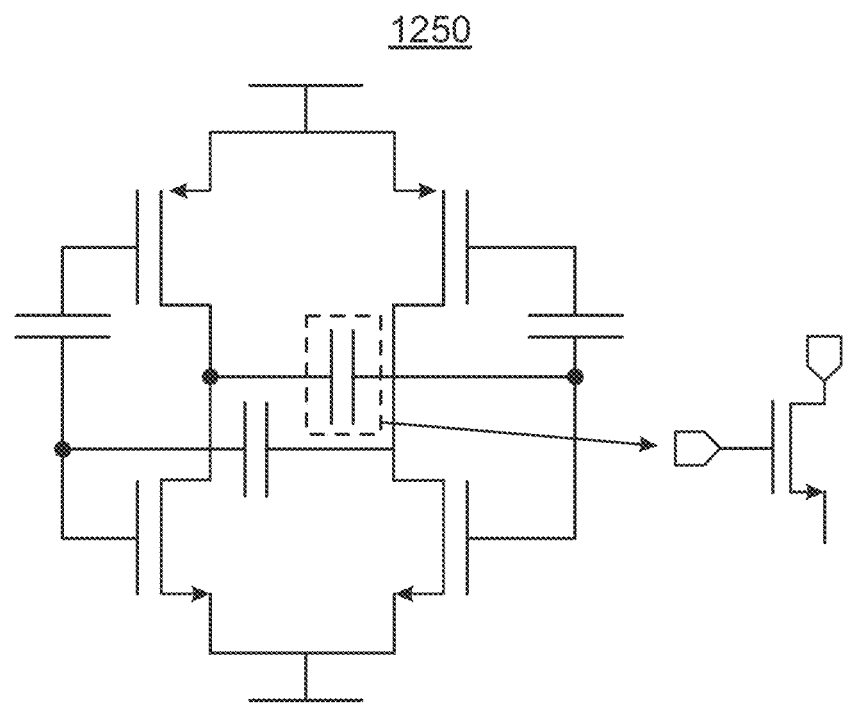
Figure 12C:
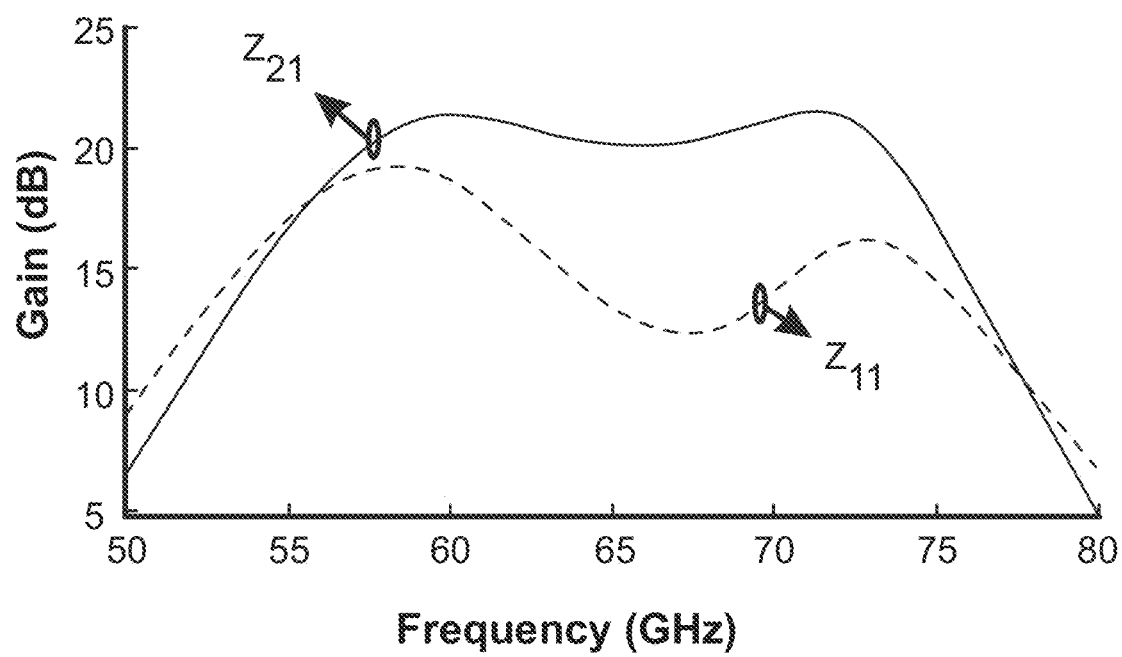

The second LNA stage of RF LNA 1110 consists of a capacitively neutralized CCR common source amplifier 1250, as illustrated in FIG. 12B. The additional parasitic capacitance introduced from the coupling capacitors connecting the NMOS and PMOS gates is mitigated by utilizing a fabrication process with a high impedance substrate. Neutralization is accomplished through FET-based feedforward neutralization, which provides higher isolation than physical capacitors across fabrication process variations. The K-factor variation of the neutralized common source stage varies less than ten percent across local and global variations, ensuring stability and high reverse isolation. The output of the RF LNA 1110 is coupled to the mixer 1120 through a fourth-order low-K coupling network for bandwidth extension. The overall RF LNA 1110 provides wideband operation (>15 GHz), low noise performance (<4.5 dB), and 21.5 dB of gain for less than 7 mW total DC power consumption in this exemplary embodiment.

Figure 13:
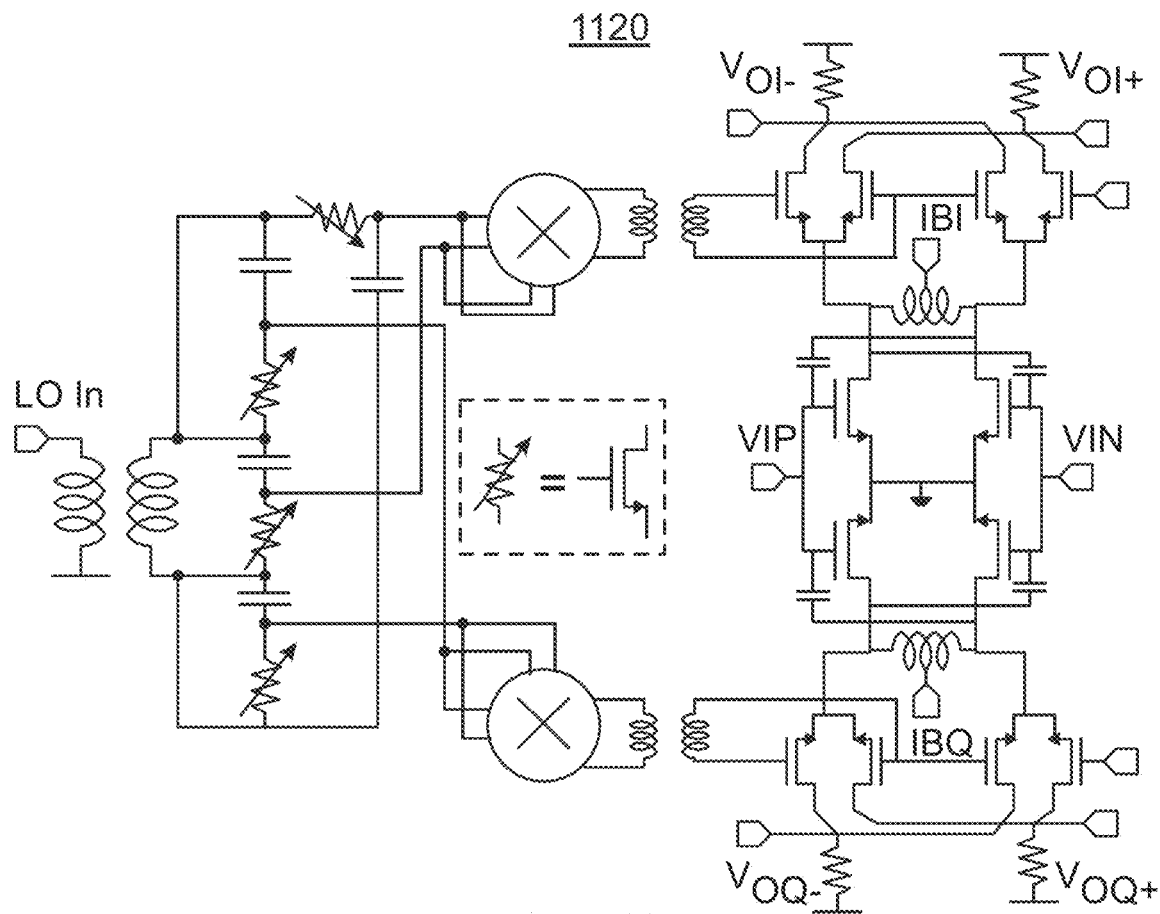
FIG. 13 illustrates a circuit schematic for a mixer that may be used as part of a receiver that incorporates CCR frequency doublers in accordance with one or more embodiments of the present invention.

The RF LNA 1110 drives the quadrature Gilbert cell mixer 1120, an exemplary design of which is illustrated in FIG. 13. Subharmonic local oscillator (LO) distribution is chosen as it eases LO distribution for large, phased array systems. The type 2 PPF 1160 generates a pair of 450 phase shifted signals which drive the quadrature CCR frequency doublers 1150. The CCR frequency doublers 1150 drive the mixer 1120, enabling subharmonic LO input. The type 2 PPF 1160 is designed for 450 phase shifting, such that the doubled output signals produce quadrature signals into the LO at 0° and 900 phase shifts. Two CCR frequency doublers 1150 and IF phase shifting was chosen over a single doubler and RF phase shifting to lower losses through the phase shifting network and simplify LO distribution. The LO distribution network is designed for broadband operation due to the use of fourth-order coupling networks for bandwidth extension on all interfaces. Active mixing was chosen over passive mixing due to the lower LO swing requirements for active mixing, as the power required to drive a passive mixer at these frequencies was more than the power consumed by the mixer 1120 and the active mixer's LO drive network.

Figure 14:
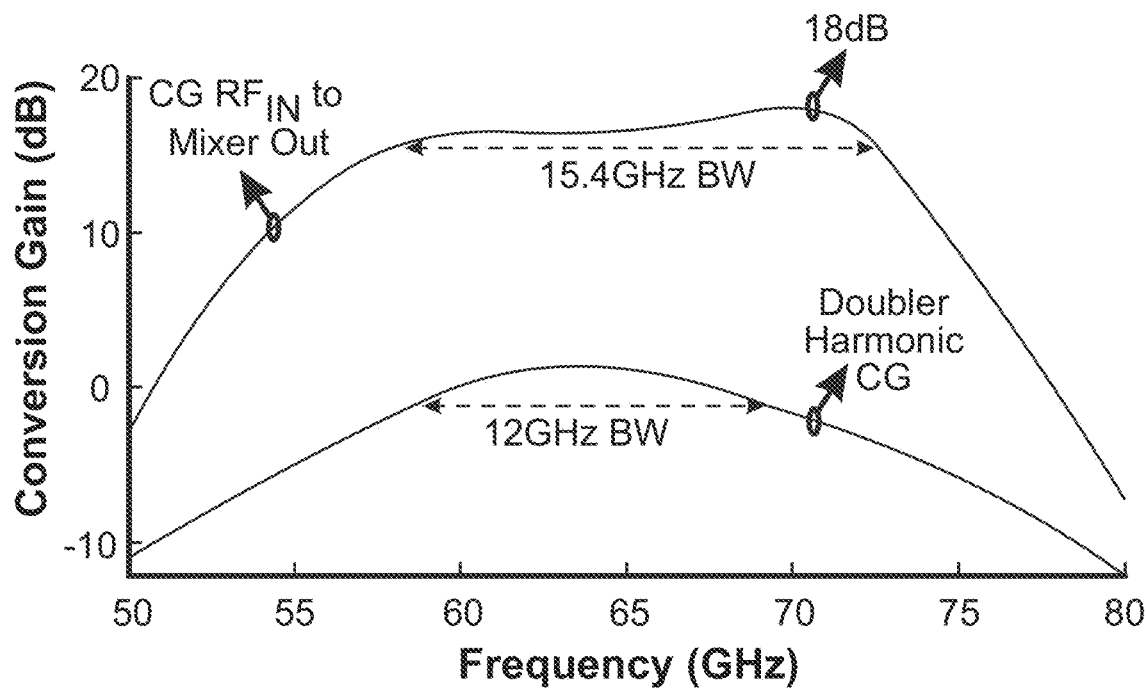
FIG. 14 illustrates the simulated conversion gain of a mixer and the combination of a low noise amplifier and the mixer that may be used as part of a receiver that incorporates CCR frequency doublers in accordance with one or more embodiments of the present invention.

The mixer 1120 comprises a pair of Gilbert-cell mixers in parallel with the LNA output. Feedforward neutralization improves the isolation gain and stability of the mixer input transconductor. The transconductor drives the switching devices with enhanced gain due to the use of a shunt inductor which resonates with the parasitic capacitance at the transconductance switching quad interface. The resonating inductor is center tapped such that additional current can be sourced into the transconductor cell, improving its transconductance. The current source is used to correct for amplitude mismatch between the I and Q paths improving image rejection. The transconductor devices are biased at IC=3.6 and utilize high voltage overdrive as these transconductor devices experience the highest signal levels in the receiver 1100, making their linearity contribution significant. The mixer 1120 does not employ CCR to preserve linearity and gain. The simulated conversion gain of the combination of the RF LNA 1110 and mixer 1120 is illustrated in FIG. 14, showing wideband operation (>15 GHz) and conversion gain (18 dB) into the baseband LNA 1130.

Phase shift in the type 2 PPF 1160 is set through tunable RC time constants. The type 2 PPF 1160 is a constant amplitude and variable phase filter, where the phase shift only equals the desired value at a single frequency point. As such, this phase-shifting approach is inherently narrow band at a given state while providing excellent amplitude balance. The type 2 PPF 1160 can provide the desired phase shift at any given frequency through tunable resistances, enabling both a tunable LO frequency and a method for correction of IQ phase shift. One advantage of this approach is the high degree of balance in the IQ signals, which ensures that both CCR frequency doublers 1150 are driven at the same power level, producing symmetric output LO signals at 0° and 900 phase shifts. The harmonic voltage conversion gain of the complete LO chain, including the CCR frequency doubler 1150 and the type 2 PPF 1160, is illustrated in FIG. 14, showing sufficient bandwidth to cover the entire RF bandwidth. The LO chain operates with an input LO power of 2 dBm, which is then voltage boosted into the CCR frequency doublers 1150 to maximize doubler conversion gain. The LO chain's harmonic conversion gain 1 dBCP is 0 dBm. Therefore, with a 2 dBm drive, the LO chain can accommodate a wider RF bandwidth.

Figure 15A:
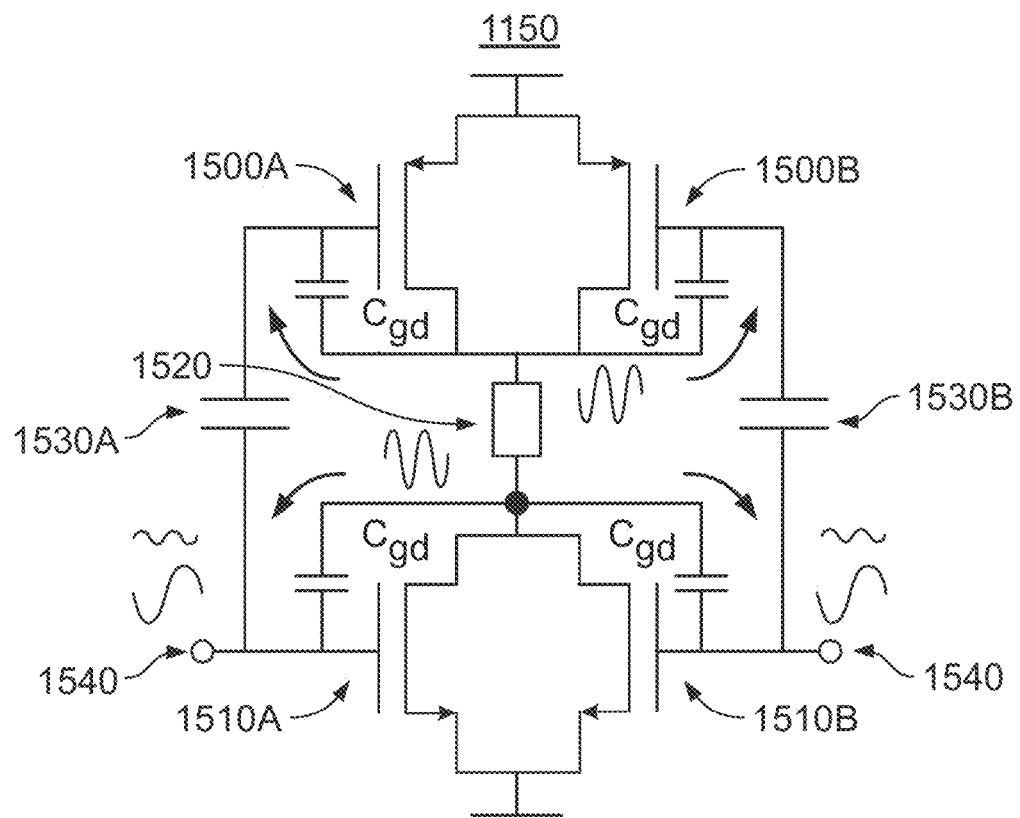
FIGS. 15A and 15B illustrate circuit schematics of a CCR frequency doubler in accordance with one or more embodiments of the present invention, and a prior art frequency doubler, respectively.
Figure 15B:
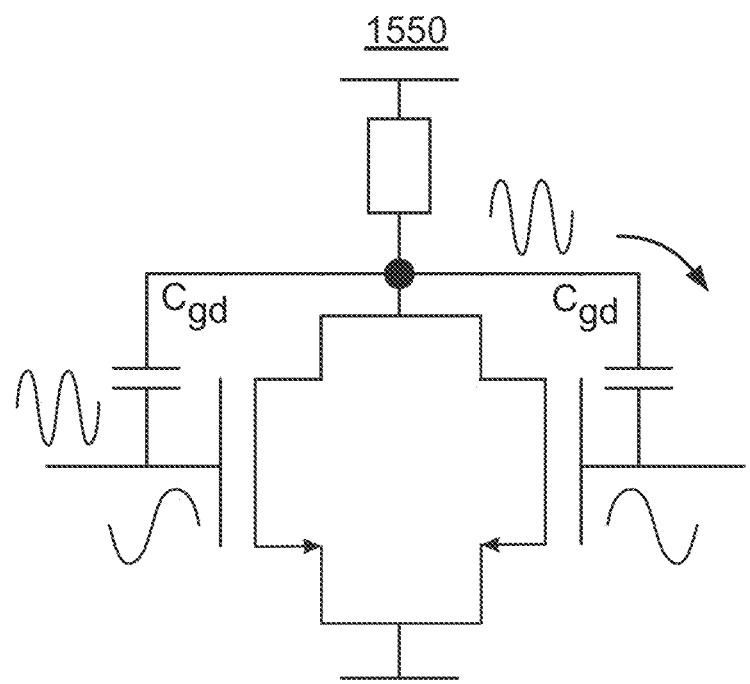

The LO chain is enabled using a compact and power-efficient double-balanced CCR frequency doubler 1150 in accordance with one or more embodiments, as illustrated in FIG. 15A. The CCR frequency doubler 1150 utilizes voltage scaling and CCR to lower power consumption, along with class C biasing and second harmonic load pull output matching to maximize efficiency. Double-balanced operation enables differential signal distribution and improves the noise immunity of the CCR frequency doubler 1150 while simultaneously reducing component count and insertion loss. Compared to a prior art double-balanced frequency doubler 1550, illustrated in FIG. 15B, that does not use CCR, the CCR frequency doubler 1150 can achieve double-balanced operation without additional 90° phase shifters, which add loss and increase complexity.

FIG. 7B illustrates that the fundamental currents produced by a CCR-based device add, while the second-order currents subtract. This effect can be generalized to all even and odd-order current harmonics by examining the Taylor series for NMOS and PMOS devices in Equations 11A, 11B, and 12. Even-order terms produce in-phase currents, and odd-order terms produce anti-phase currents as the voltage driving ($V_{SG}=-V_{GS}$) the terms in the Taylor series for the NMOS and PMOS devices are opposite.

$$I_{DnMOS} = I_{0n} + g_{mn}V_{GS} + g'_{mn}V_{GS}^2 + g''_{mn}V_{GS}^3 + g'''_{mn}V_{GS}^4 + \ldots, \text{ and} \quad \text{(Eq. 11A)}$$

$$I_{DpMOS} = I_{0p} + g_{mp}V_{SG} + g'_{mp}V_{SG}^2 + g''_{mp}V_{SG}^3 + g'''_{mp}V_{SG}^4 + \ldots \quad \text{(Eq. 11B)}$$

Where substituting $V_{SG}=-V_{GS}$ into Equation 11B produces:

$$I_{DpMOS} = I_{0p} - g_{mp}V_{GS} + g'_{mp}V_{GS}^2 - g''_{mp}V_{GS}^3 + g'''_{mp}V_{GS}^4 + \ldots \quad \text{(Eq. 12)}$$

When complementary devices are configured, for example, as illustrated in FIG. 15A, the even-order currents will produce a differential voltage at the output nodes to the load 1520, for example, a resonator. Compared to the prior art push-push frequency doubler 1550 illustrated in FIG. 15B, the complementary implementation of the CCR frequency doubler 1150 (FIG. 15A) provides inherently double-balanced operation without the need for any phase shifting. Consider the case where the performance of the NMOS and PMOS devices are substantially the same. In this case, second-order leakage into the input is suppressed, alleviating the need for a second harmonic trapping network on the input. The lack of a required second harmonic trapping network and the inherent double-balanced nature of the CCR frequency doubler 1150 reduce the component count, improve efficiency, and reduce the power consumption required.

The CCR frequency doubler 1150 (FIG. 15A) includes first and second PMOS transistors 1500A, 1500B and first and second NMOS transistors 1510A, 1510B, with a load 1520 located therebetween. The gates of the first PMOS transistor 1500A and first NMOS transistor 1510A are coupled via a first coupling capacitor 1530A, while the gates of the second PMOS transistor 1500B and second NMOS transistor 1510B are coupled via a second coupling capacitor 1530B. As illustrated, the doubled frequency is found at either terminal of the load 1520, i.e., the output nodes of the CCR frequency doubler 1150, with the doubled frequencies being opposite in phase as required. In contrast, both the fundamental frequency and a small amplitude of the doubled frequency are found in the circuit arms containing the coupling capacitors 1530A, 1530B. The input nodes 1540 are coupled to the circuit arms containing the coupling capacitors 1530A, 1530B. Note that the illustrated capacitances $C_{gd}$ correspond to the parasitic capacitances between corresponding gates and drains—they are not separate intentional capacitors, such as the coupling capacitors 1530A, 1530B.

The CCR frequency doubler 1150 (FIG. 15A) provides a robust degree of harmonic cancellation at the input and the output, even across local variations. Based on Monte-Carlo simulations, the second-harmonic rejection at the input is better than 20 dB with a variance of 0.3 dB. Likewise, the fundamental leakage to the output is suppressed by 39 dB with a variance of 4 dB extracted through Monte-Carlo simulations.

Figure 16:
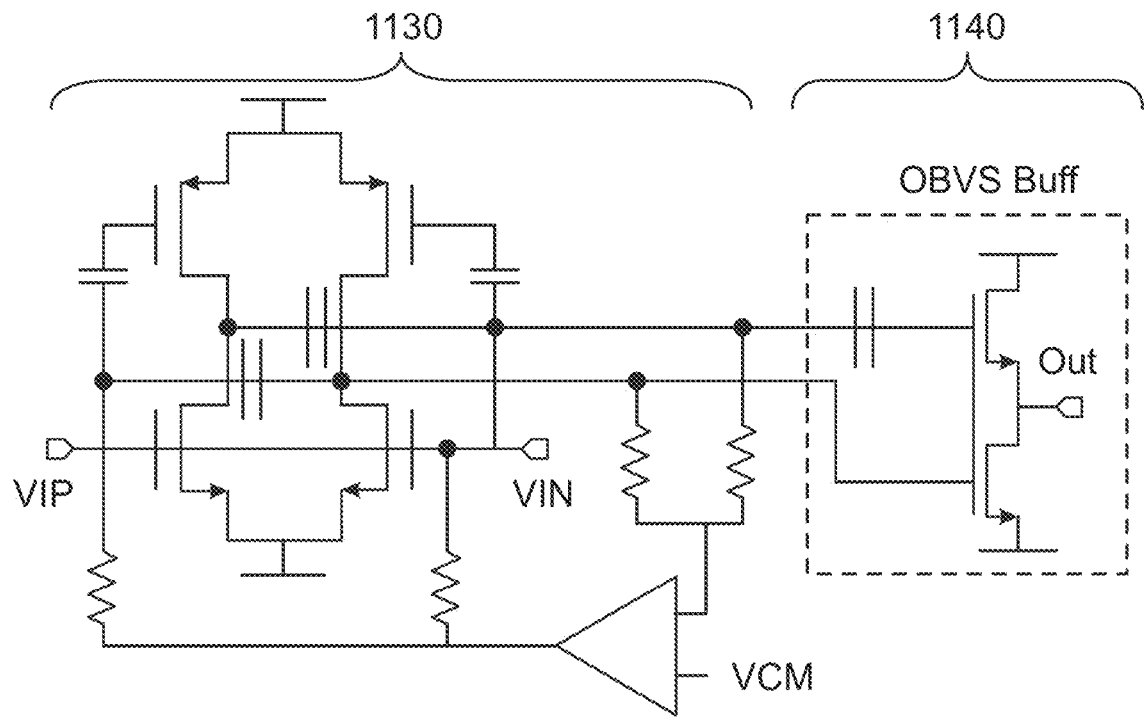
FIG. 16 illustrates a circuit schematic for a pair of baseband low noise amplifiers and an output buffer that may be used as part of a receiver that incorporates CCR frequency doublers in accordance with one or more embodiments of the present invention.

The signal out of the mixer 1120 is coupled into a pair of IQ baseband LNAs 1130 and then to the drive output buffer 1140, as illustrated in FIG. 16. Note that FIG. 16 illustrates only one of the IQ channels, and thus must be duplicated for the full output buffer 1140. The pair of IQ low noise baseband amplifier provide gain and then drive a pair of corresponding observability buffers for measurement in a 50-ohm system. The IQ low noise baseband amplifiers are based on the same core CCR common source amplifier used in the RF LNA 1110. The output is biased through a common mode feedback loop to maximize linearity by setting $V_{DS}=V_{DD}/2$, enabling maximum swing on both devices. The transistors in the baseband LNAs 1130 are biased at a much lower current density when compared to the transistors in the RF LNA 1110, for an IC<1 for 15 µA/µm. Despite the low current density biasing, the transistors in the baseband LNAs 1130 can provide over 5 GHz of RF bandwidth, enabling low noise RF gain through high frequency. The overall IF bandwidth is limited by the interface between the mixer 1120 and the IQ baseband LNAs 1130, as the large devices required for low noise and low power operation reduce the bandwidth at this interface. Each of the low-power, IQ baseband LNAs 1130 drives a corresponding totem-pole topology observability buffer 1140, which converts the differential output signal into a single-ended 50-ohm signal for measurement. The IQ baseband LNAs 1130 each consume 3 mW of DC power.

Receiver Characterization

Figure 17:
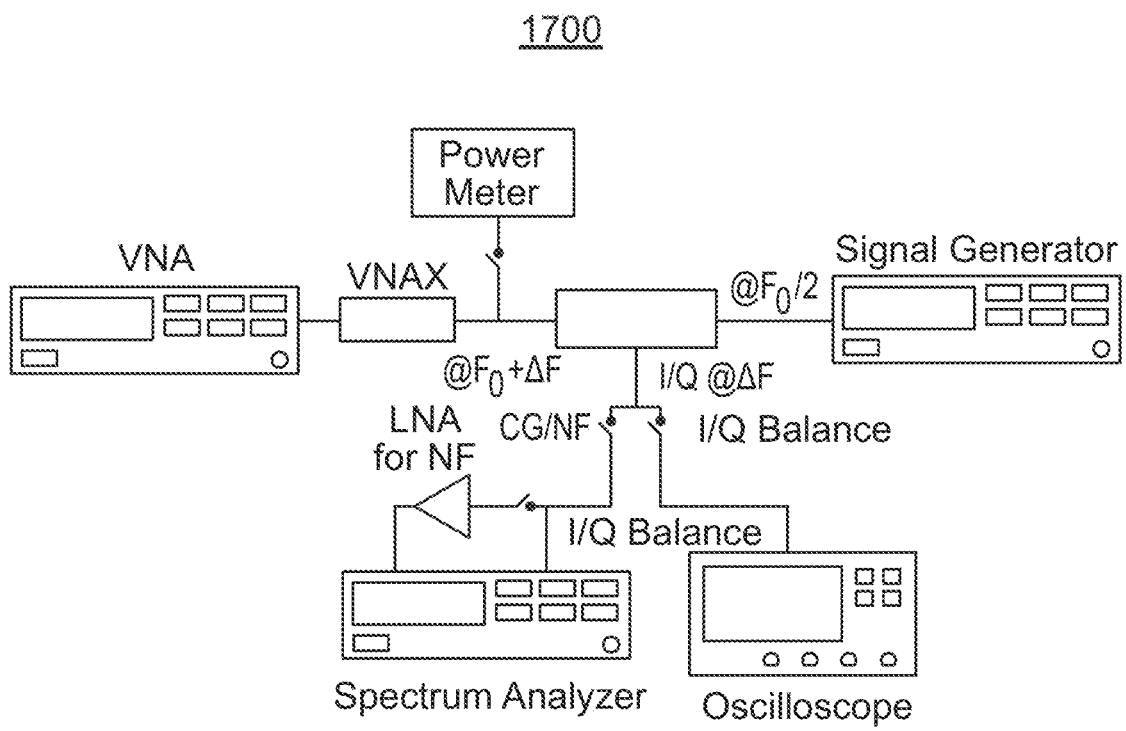
FIG. 17 illustrates a measurement system employed to characterize a receiver that incorporates CCR frequency doublers in accordance with one or more embodiments of the present invention.

The receiver 1100 (FIG. 11) has been implemented in a 45 nm RF PDSOI process utilizing a high-impedance substrate and thick RF interconnect layers. The receiver 1100 occupies an area of 0.46 mm², including IO and biasing pads. Bias signals are brought out through wire bonds onto a chip onboard PCB, while the RF, LO, and IQ output signals are obtained through wafer-probed measurements. A vector network analyzer extender (VNAX) generates RF signals, with the overall measurement system 1700 illustrated in FIG. 17. The conversion gain, bandwidth, noise, and linearity of the receiver 1100 are measured and compared to the prior art. The overall power consumption of the receiver 1100 is 23 mW from a 1 V supply. The RF LNA 1110, the mixer 1120, the CCR frequency doublers 1150, and the baseband LNAs 1130 consume 6 mW, 5 mW, 7 mW, and 6 mW, respectively.

The RF input is generated by a vector network analyzer driving the VNAX V-band extender with a built-in attenuator to set the power into the receiver 1100 within the linear regime. The RF input power is calibrated through a waveguide power meter. The sub-harmonic LO signal is generated with a signal generator, whose power is calibrated using a spectrum analyzer. The IQ outputs are obtained through GSGSG probing at the output. The conversion gain, bandwidth, 1 dBCP, and noise figure are measured with a spectrum analyzer. In contrast, IQ amplitude and phase imbalance are measured with an oscilloscope.

Figure 18:
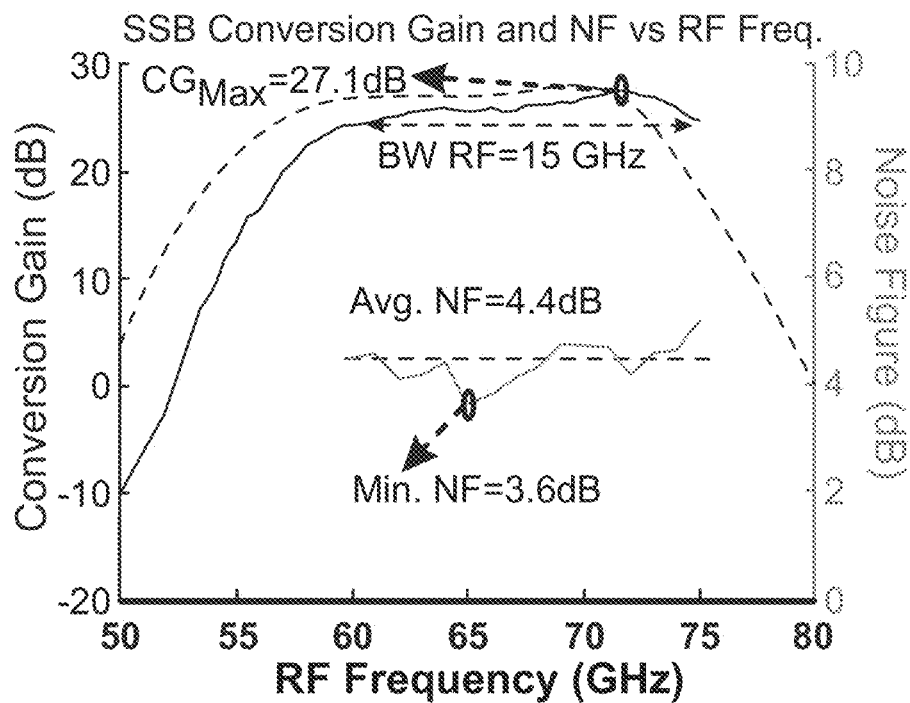
FIG. 18 illustrates the measured small signal parameters as a function of frequency for a receiver that incorporates CCR frequency doublers in accordance with one or more embodiments of the present invention.
Figure 19A:
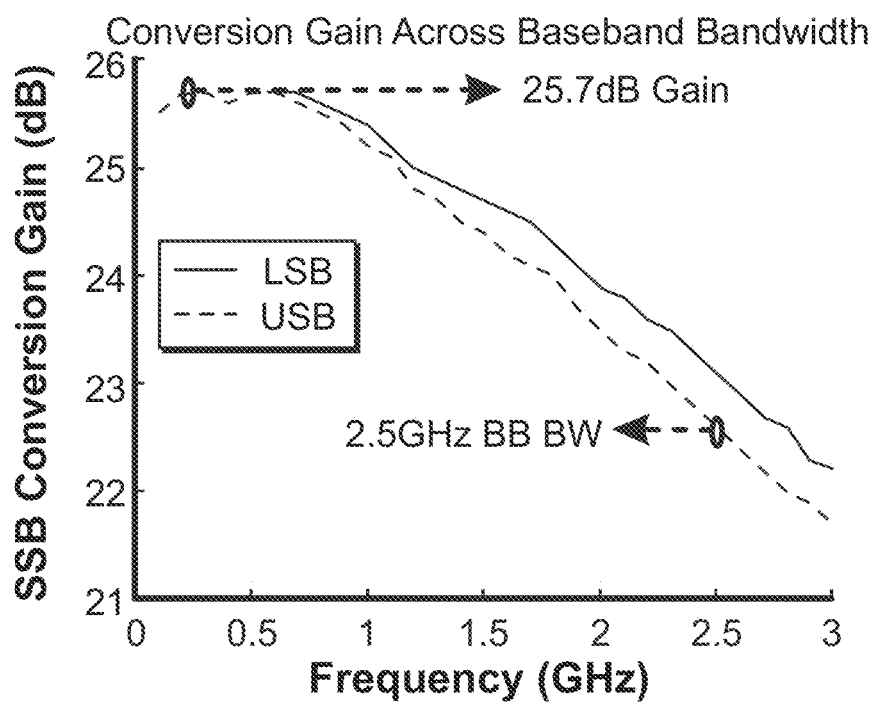
FIGS. 19A and 19B illustrate the measured single sideband conversion gain as a function of frequency and input power, respectively, for a receiver that incorporates CCR frequency doublers in accordance with one or more embodiments of the present invention.
Figure 19B:
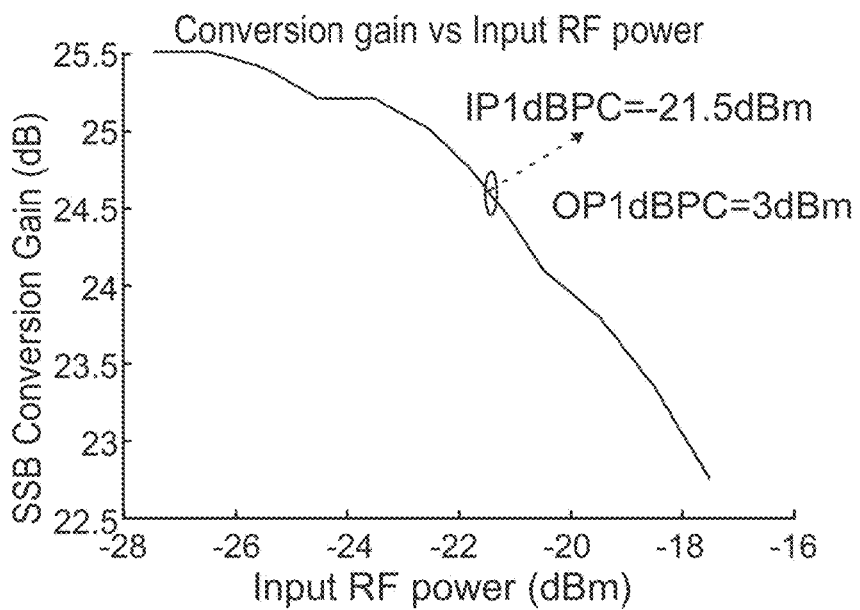

The measured single sideband (SSB) conversion gain of the receiver 1100 is illustrated in FIG. 18, showing a wide 3 dB RF bandwidth of 15 GHz centered around 67 GHz with a high conversion gain of 27.1 dB peak gain. SSB conversion gain is measured by sweeping the RF input and sub-harmonic LO, where the IF outputs are set to a constant 1 GHz offset from the carrier. Noise figure measurement is also illustrated in FIG. 18, where the double sideband (DSB) noise figure (NF) is measured with a noise source and has an average of 4.4 dB and a minimum measured NF of 3.6 dB over the 3 dB RF bandwidth of 15 GHz. Holding the RF signal constant while sweeping the LO frequency enables measurement of the IF bandwidth, as illustrated in FIG. 19A, which is measured to be 2.5 GHz. The IF bandwidth is limited by the pole associated with the output of the mixer 1120 and the input to the baseband LNAs 1130. The input referred 1 dBCP is measured as −1.5 dBm at mid-band (67 GHz) for an output 1 dBCP of 3 dBm, as illustrated in FIG. 19B. The TOI of the receiver 1100 is simulated at mid-band as −15 dBm. Uncalibrated IQ mismatch is measured as 9° phase imbalance and 1 dB amplitude imbalance, enabling 20 dB of sideband suppression. These errors can be reduced to below 0.5 dB and 1° with bias corrections to the mixer 1120 and the type 2 PPF 1160.

A comparison of the receiver 1100 to various prior art receivers is found in Table I, showing excellent noise linearity and power performance compared to the prior art receivers. The receiver 1100 offers similar linearity levels as several of the prior art receivers, while producing much better noise performance due to the low-power RF LNA 1110. The power consumption of the receiver 1100 compares very favorably with the prior art LNA-based receivers, overall showing an excellent Noise Figure-DC power consumption tradeoff, making the receiver 1100 an ideal candidate for high sensitivity and low power receivers.

TABLE 1

| | Comparison of Receiver Characteristics | | | | | | |
|---|---|---|---|---|---|---|---|
| | Receiver 1100 | Vigilante | Iotti | Papotto | Jang | Murakami | Kankuppe |
| $P_{DC}$ (mW) | 23 | 57 | 12 | 27 | 153.4 | 42*** | 10 |
| $NF_{min}$ (dB) | 3.6 | 9.5 | 8 | 8.2 | 10.8 | 9 | 10.5 |

TABLE 1-continued

Comparison of Receiver Characteristics

|  | Receiver 1100 | Vigilante | Iotti | Papotto | Jang | Murakami | Kankuppe |
|---|---|---|---|---|---|---|---|
| $G_{max}$ (dB) | 27.1 | 23.6 | 25.1 | 33 | 28.2 | 30 | 46 |
| $F_C$ (GHz) | 67 | 75 | 85 | 77 | 120 | 79 | 61 |
| 3 dB BW (GHz) | 15 | 21.7 | 10* | 11 | 26 | 4 | 10 |
| 1 dBCP (dBm) | −21.5 | −25.3 | −20.4** | −23.5 | −26.7 | −22.3 | −43 |
| Area (mm$_2$) | 0.47 | 0.675 | 0.085 | 0.96 | 1.52 | 0.8 | 4.13 |

*Estimated from plot, S$_{11}$ BW 30 GHz,
**Estimated average from plot,
***Excluding BB blocks Vigilante: M. Vigilante and P. Reynaert, "On the Design of Wideband Transformer-Based Fourth Order Matching Networks for E-Band Receivers in 28-nm CMOS," IEEE Journal of Solid-State Circuits, v. 52, no. 8, pp. 2071-2082 (2017).

Iotti: L. Iotti et al., "A 12 mW 70-to-100 GHz Mixer-First Receiver Front-End for mm-Wave Massive-MIMO Arrays in 28 nm CMOS," Proceedings of 2018 IEEE International Solid-State Circuits Conference, pp. 414-416 (2018).

Papotto: G. Papotto et al., "A 27-mW W-Band Radar Receiver With Effective TX Leakage Suppression in 28-nm FD-SOI CMOS," IEEE Transactions on Microwave Theory and Techniques, v. 69, no. 9, pp. 4132-4141 (2021).

Jang: T. H. Jang et al., "120-GHz Wideband I/Q Receiver Based on Baseband Equalizing Technique," IEEE Journal of Solid-State Circuits, v. 56, no. 6, pp. 1697-1710 (2021).

Murakami: T. Murakami et al., "A 9 dB Noise Figure Fully Integrated 79 GHz Automotive Radar Receiver in 40 nm CMOS Technology," Proceedings of 2019 IEEE Radio Frequency Integrated Circuits Symposium, pp. 307-310 (2019).

Kankuppe: A. Kankuppe et al., "A Wideband 62-mW 60-GHz FMCW Radar in 28-nm CMOS," IEEE Transactions on Microwave Theory and Techniques, v. 69, no. 6, pp. 2921-2935 (2021).

Alternative Frequency Doubler Designs

Figure 20:
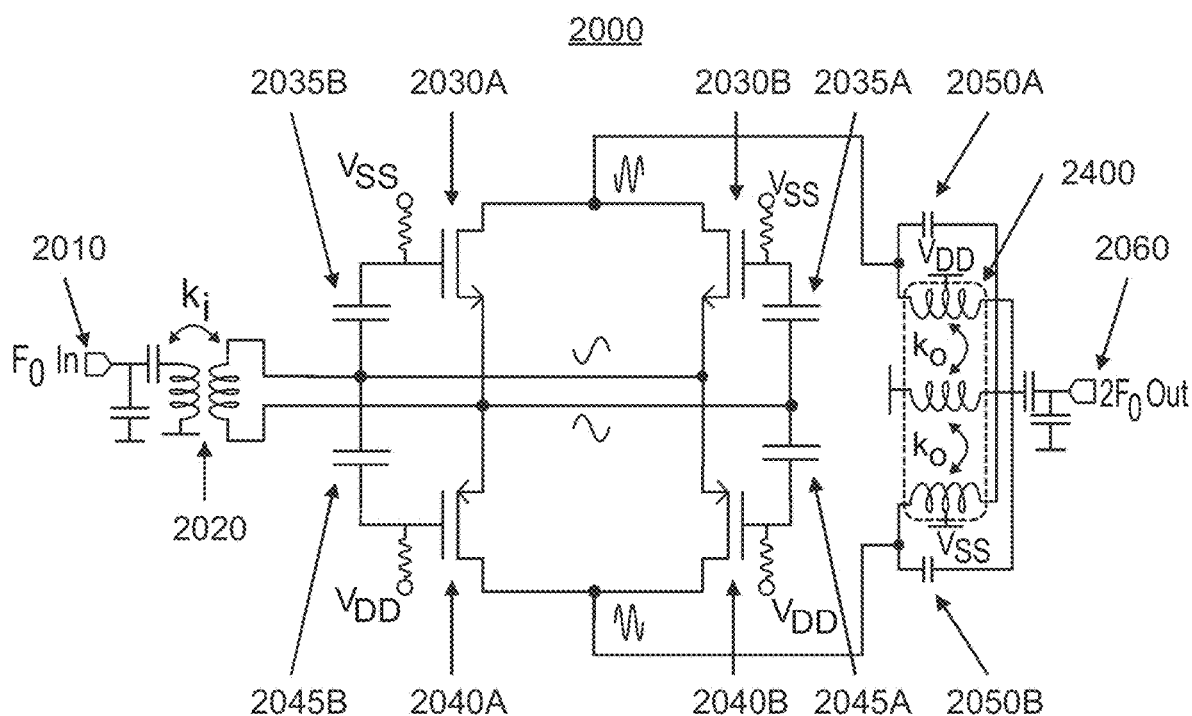
FIG. 20 illustrates a circuit schematic of a CCR frequency doubler in accordance with one or more embodiments of the present invention.

FIG. 20 illustrates a CCR frequency doubler 2000 in accordance with at least one other embodiment of the present invention. The CCR frequency doubler 2000 utilizes complementary NMOS and PMOS devices to suppress second-order leakage on the input while simultaneously scaling supply voltage by a factor of two, enabling high efficiency. The lack of second-order trapping networks allows significant area savings compared to prior art frequency doubler designs.

An input 2010 receives the input frequency at Fo and is coupled to the remainder of the CCR frequency doubler 2000 via an input transformer 2020, having a coupling ratio ki. A first output terminal of the input transformer 2020 is coupled to the source of a first NMOS transistor 2030A and the source of a first PMOS transistor 2040A. The second output terminal of the input transformer 2020 is coupled to the source of a second NMOS transistor 2030B and the source of a second PMOS transistor 2040B. Both of the output terminals of the input transformer 2020 are capacitively coupled between the supply voltage $V_{DD}$ and ground $V_{SS}$. The gates of both NMOS transistors 2030A, 2030B are tied to ground $V_{SS}$, while the gates of both PMOS transistors 2040A, 2040B are tied to the supply voltage $V_{DD}$. Due to the topology of the CCR frequency doubler 2000, each of the NMOS 2030A, 2030B, and PMOS 2040A, 2040B transistors sees only half of the supply voltage, i.e., $V_{DD}/2$. The CCR frequency doubler 2000 further includes first through fourth coupling capacitors 2035A, 2035B, 2045A, 2045B. The first coupling capacitor 2035A couples the source of the first NMOS transistor 2030A and the gate of the second NMOS transistor 2030B, and the second coupling capacitor 2035B couples the source of the second NMOS transistor 2030B and the gate of the first NMOS transistor 2030A. The third coupling capacitor 2045A couples the source of the first PMOS transistor 2040A and the gate of the second PMOS transistor 2040B, and the fourth coupling capacitor 2045B couples the source of the second PMOS transistor 2040B and the gate of the first PMOS transistor 2040A.

The drains of the NMOS transistors 2030A, 2030B are coupled together, coupled to a first terminal of a first primary coil of a triple transformer 2400 (illustrated in detail in FIG. 24), and to a second terminal of a second primary coil of the triple transformer 2400 via a first coupling capacitor 2050A. In corresponding fashion, the drains of the PMOS transistors 2040A, 2040B are coupled together, coupled to a first terminal of the second primary coil of the triple transformer 2400, and to a second terminal of the first primary coil of the triple transformer 2400 via a second coupling capacitor 2050B. As illustrated in FIG. 20, the first and second primary coils of the triple transformer 2400 are of opposite polarity due to the direction of current flow. An output 2060 of the CCR frequency doubler 2000 is coupled to the output terminal of the secondary coil of the triple transformer 2400 and outputs the doubled output frequency $2F_0$. The coupling ratio between the first and second primary coils of the triple transformer 2400 and the secondary coil of the triple transformer 2400 is $k_o$. FIG. 20 also illustrates the frequencies ($F_0$ or $2F_0$) as well as their phases (0° or 180°) at various points within the CCR frequency doubler 2000.

Figure 21A:
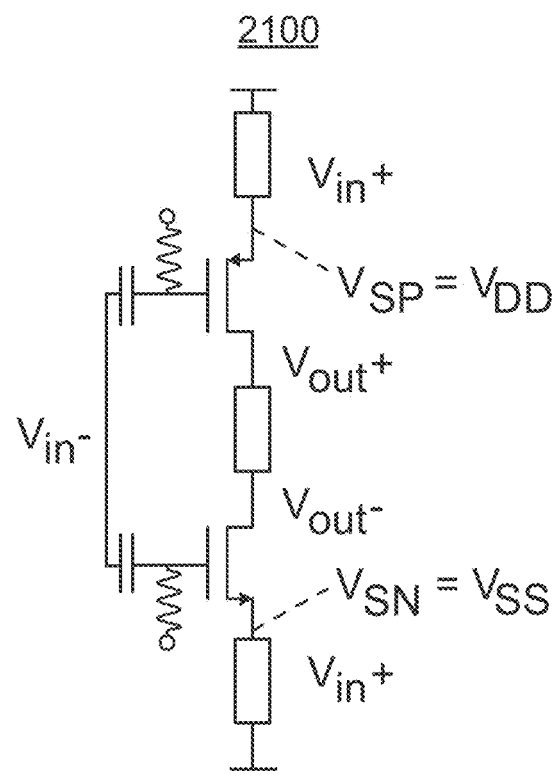
FIGS. 21A and 21B illustrate circuit schematics of alternative half circuits that may be employed as part of a CCR frequency doubler in accordance with one or more embodiments of the present invention.
Figure 21B:
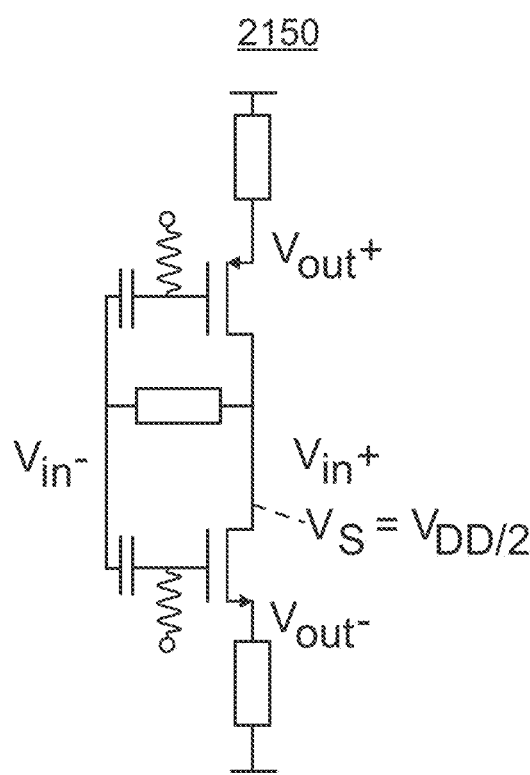

An alternative half circuit 2100 of the CCR frequency doubler 2000 in FIG. 20 is illustrated in FIG. 21A. The half circuit 2100 uses a more standard configuration resembling a CMOS inverter, compared to the reversed half circuit 2150 illustrated in FIG. 21B. The RF voltages and relative impedances of both topologies are unchanged; however, the DC voltages across device terminals differ. The reversed half circuit 2150 can enable negative gate-source bias voltages without requiring negative voltage generation on-chip, as the source nodes are close to $V_{DD}/2$. As such, the reversed half circuit 2150 is the preferred alternative when compared to the standard half circuit 2100.

Frequency doubler bias points map to traditional amplifier classes through conduction angle. Unlike traditional RF power amplifiers, however, the current for a frequency doubler is optimized at the desired harmonic (the second harmonic for a frequency doubler), not at the fundamental. Examining the harmonic components generated by RF devices biased for shallow conduction angles, the relative strength of higher order harmonics increases compared to the DC current as the current pulse generated from the transistor approximates an impulse function.

Figure 22A:
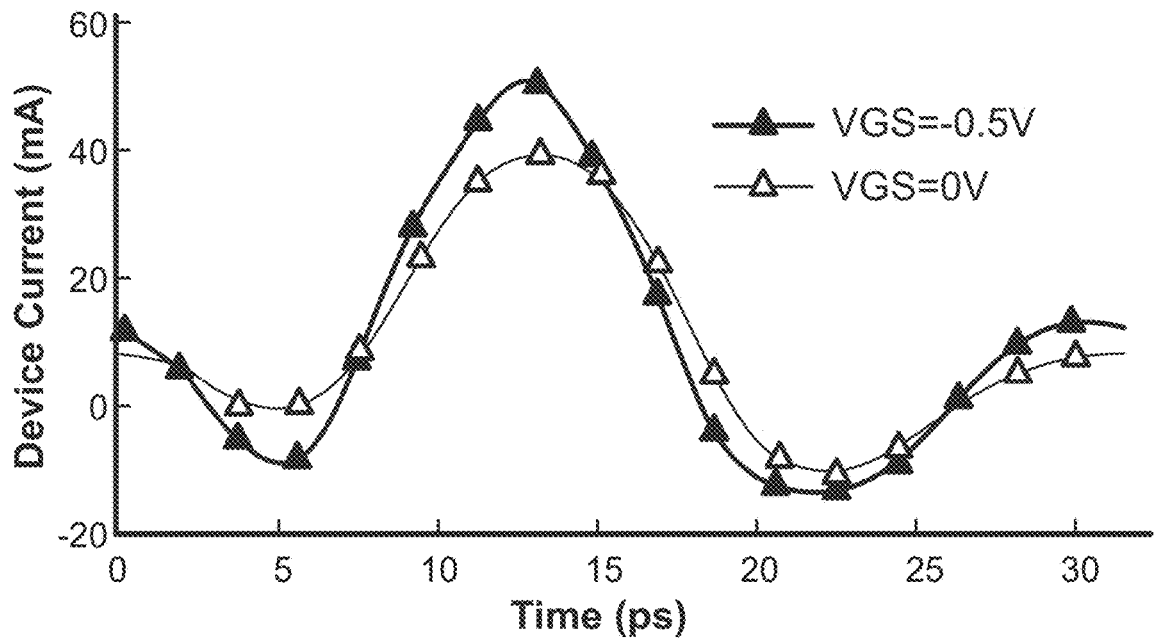
FIGS. 22A and 22B illustrate the measured drain current and harmonic currents, respectively, for a CCR frequency doubler in accordance with one or more embodiments of the present invention.
Figure 22B:
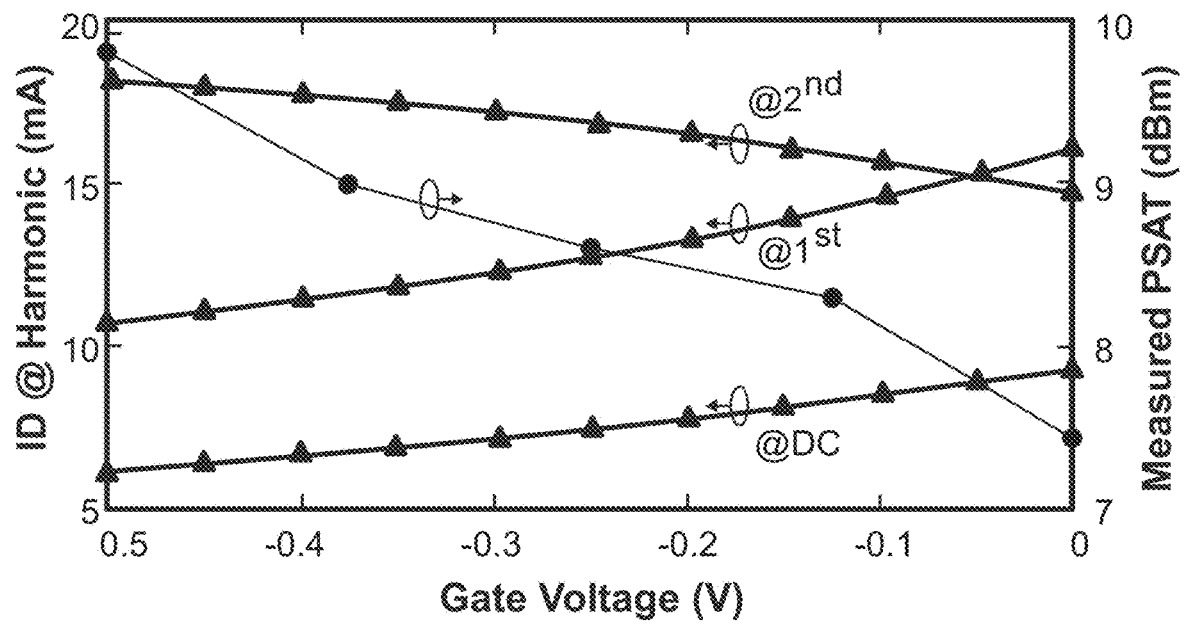

FIG. 22A compares drain current between differing bias points: a class-C bias point using $V_{GS}$=0 V and a deep class-C bias point with $V_{GS}$=−0.5V. Both cases employed a 10 mA DC bias current. The deep class-C bias point provides a stronger second harmonic current, roughly 2 dB higher than the class-C bias point. FIG. 22B illustrates the measured relative harmonic current amplitudes across varying bias points. The deep class-C bias point increases the relative strength of the second harmonic compared to the fundamental and DC terms. The increased magnitude of the second harmonic current indicates that the saturated output power $P_{Sat}$ should increase as the device is biased deeper into class C. FIG. 22B illustrates the measured $P_{Sat}$ of the fabricated CCR frequency doubler 2000 (FIG. 20), as a function of $V_{GS}$. As measured, $P_{Sat}$ increases from 7.4 dB with a 0 V bias on $V_{GS}$ to 9.8 dB with $V_{GS}$=−0.5 V, showing a corresponding efficiency increase from less than 20% to 25%.

As driving signal power increases, short-channel effects become dominant as velocity and channel mobility saturate. These short channel effects decouple the dependence of the drain current on the applied drain voltage, as shown in Equation 13.

$$I_{SAT}=WC_{ox}[V_{GS}-V_T-V_{DSSat}]v_{sat},\qquad(\text{Eq. 13})$$

where $I_{SAT}$ is the saturated device drain current, $V_{DSSat}$ is defined as $L/\mu_n v_{sat}$, and $v_{sat}$ is the saturation velocity of the charge carriers.

Figure 23A:
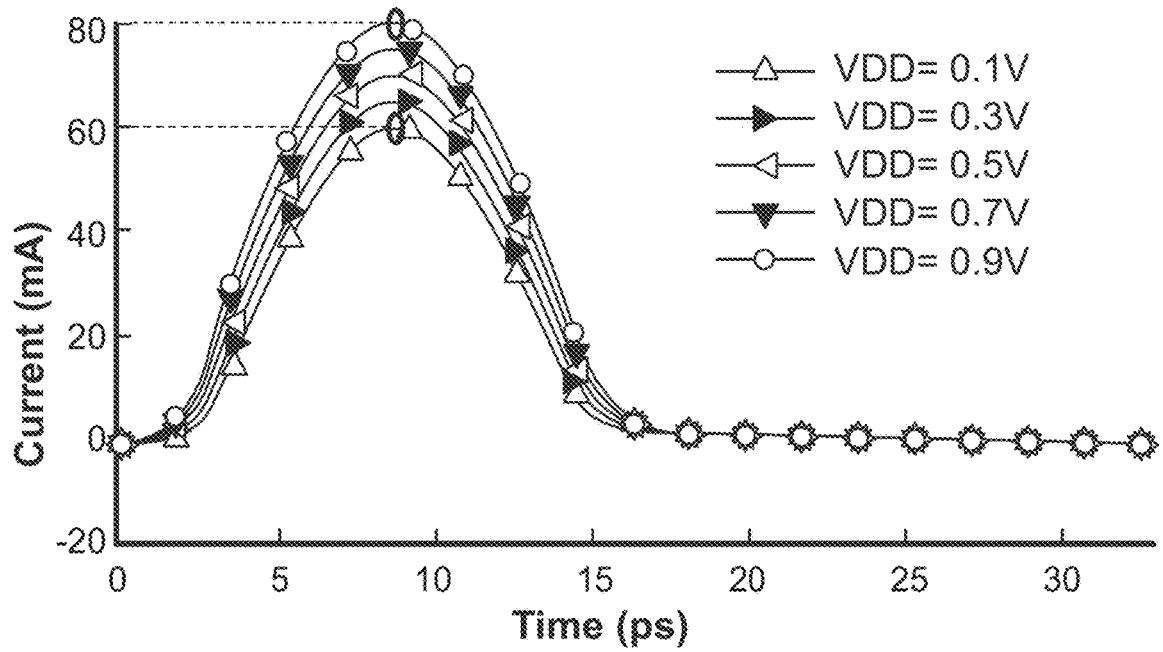
FIGS. 23A and 23B illustrate the supply current and harmonic current generation as a function of supply voltage, respectively, for a CCR frequency doubler in accordance with one or more embodiments of the present invention.
Figure 23B:
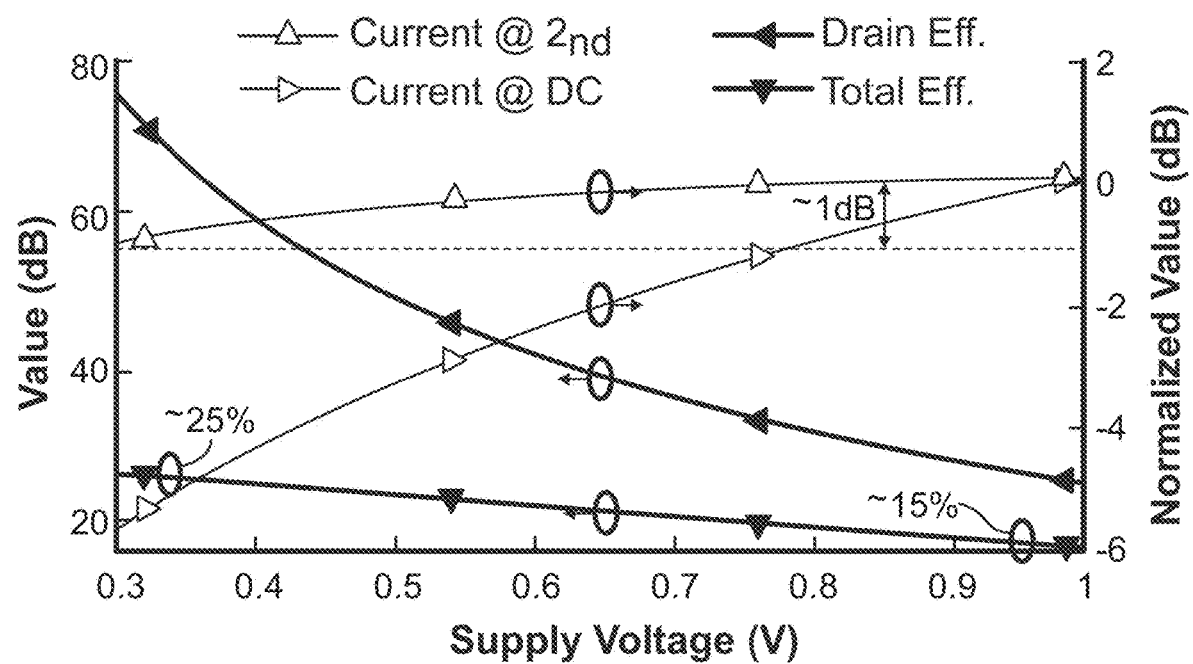

As illustrated in FIG. 23A, scaling the supply voltage for the class C frequency doubler produces a 9× increase in $V_{DD}$, but the peak current only increases 25%. Examining harmonic current generation across supply voltage scaling, as illustrated in FIG. 23B, decreased supply voltage reduces the second harmonic current by roughly 1 dB (and therefore output power at the second harmonic) but decreases DC power consumption by a factor of 4. The drastic decrease in DC power consumption for a slight decrease in harmonic power enables efficiency improvements in both drain and total efficiency, improving the total efficiency of the CCR frequency doubler 2000 by roughly 60% and the drain efficiency by a factor of 3.

Figure 24:
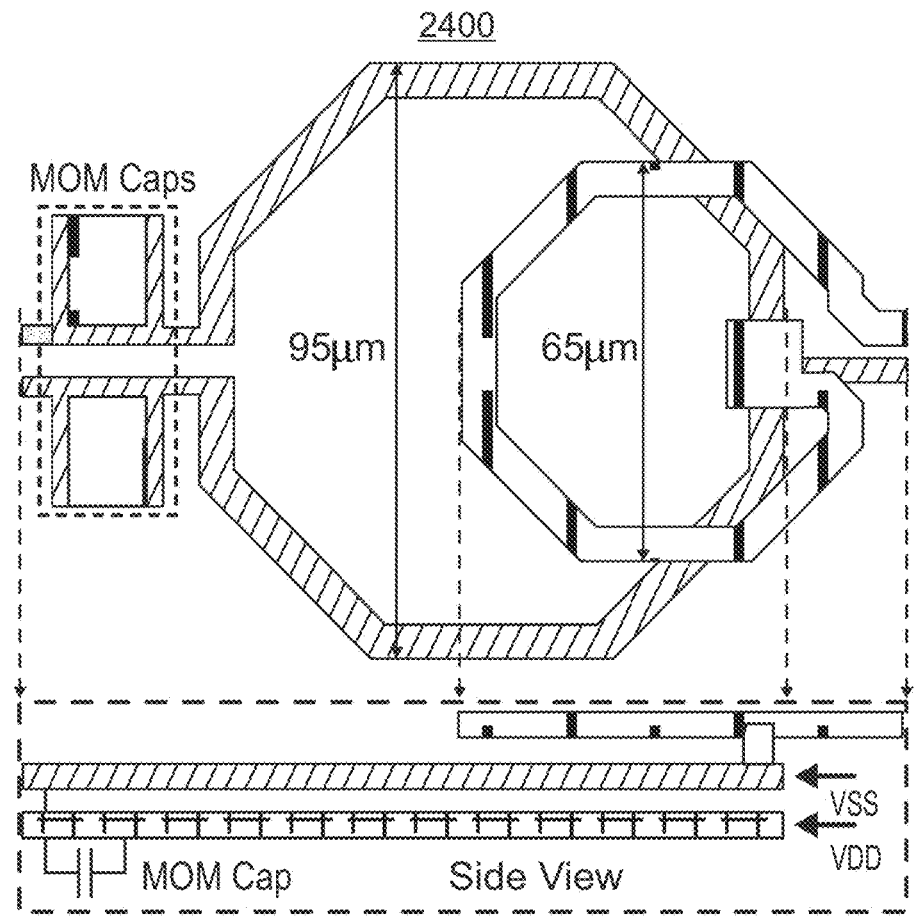
FIG. 24 illustrates a circuit layout for a triple transformer that may be used as part of a CCR frequency doubler in accordance with one or more embodiments of the present invention.

The CCR frequency doubler 2000 employs transformer-based fourth-order impedance matching networks for bandwidth extension on the input and the output. The layout of the output network is complicated by the need to provide differing DC voltage levels to the NMOS and PMOS devices. A triple transformer 2400 is employed, as illustrated in FIG. 24, where twin primary coils are stacked directly over each other and capacitively coupled at their terminals to enable a single transformer capable of providing different DC voltages to each terminal.

Figure 25:
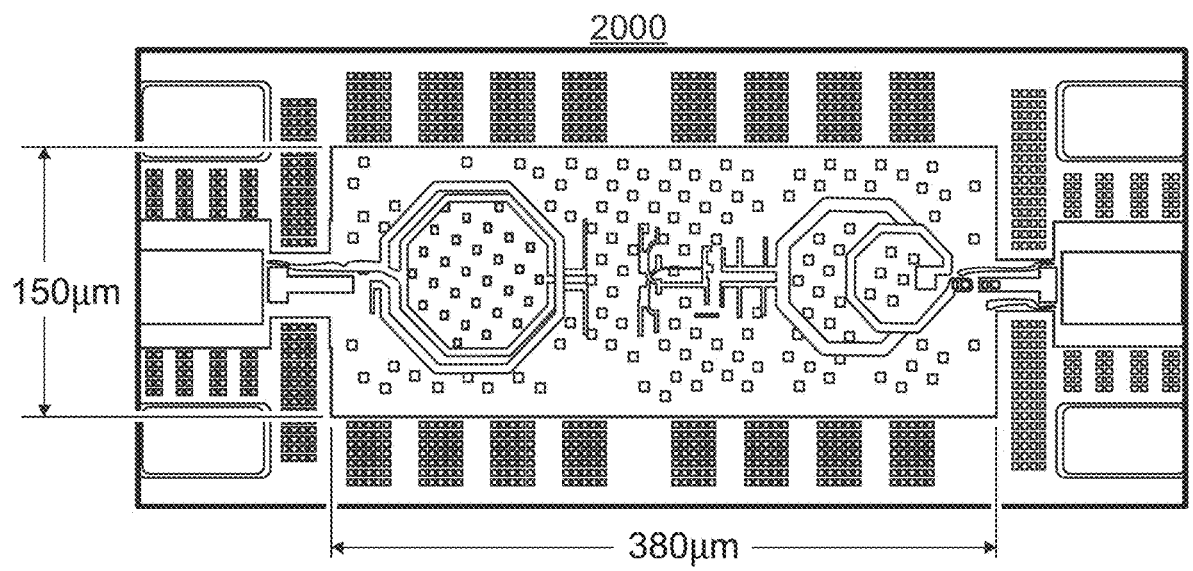
FIG. 25 illustrates a die photograph of a CCR frequency doubler in accordance with one or more embodiments of the present invention.

The CCR frequency doubler 2000 was fabricated in a commercial 45 nm RF-SOI CMOS process where FIG. 25 is a photograph of the resultant die. The triple transformer 2400 is illustrated in the righthand portion of FIG. 25, while a double-stacked input transformer 2020 is illustrated in the lefthand part of FIG. 25. The fabricated CCR frequency doubler occupies a small active area of 0.058 mm². The CCR frequency doubler is supplied with a standard 1 V supply voltage while consuming between 7 and 8 mA of DC bias current.

Figure 26:
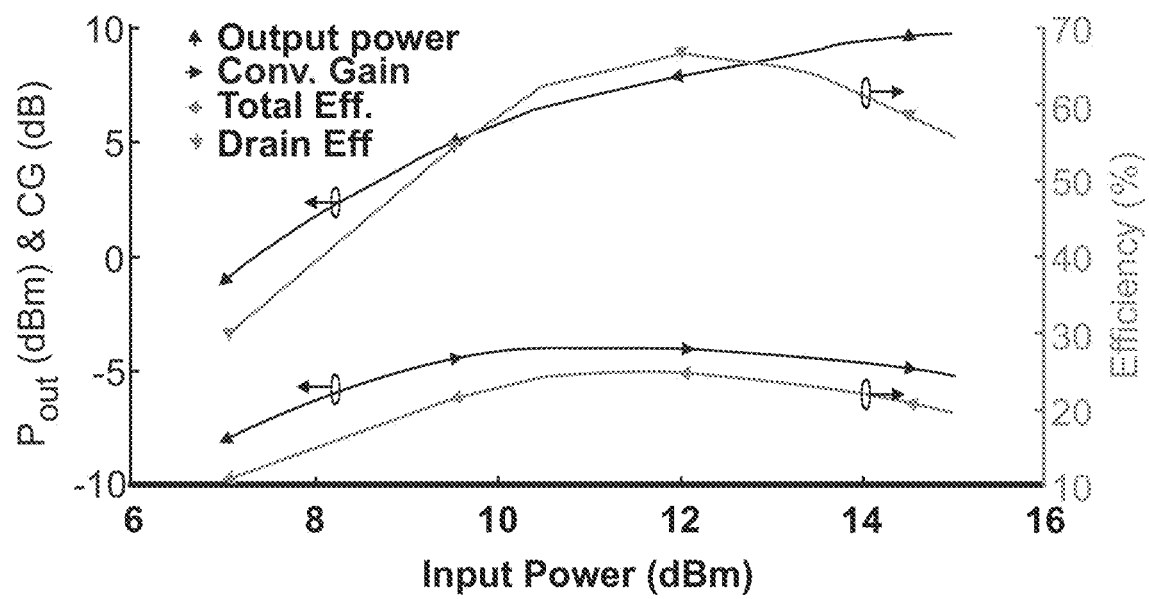
FIG. 26 illustrates various measured parameters for a CCR frequency doubler in accordance with one or more embodiments of the present invention.

Performance of the CCR frequency doubler as a function of input power at 60 GHz is illustrated in FIG. 26, where RF output power, conversion gain, and efficiencies (total and drain) are presented. The saturated output power is measured as 9.8 dBm, and the peak conversion gain is above −4 dB. The CCR frequency doubler achieved maximum efficiency near its 1 dB compression point 1 dBCP. It maintains an overall efficiency of greater than 10% for more than 10 dB of output power backoff while maintaining greater than 30% drain efficiency across the same output power range.

Figure 27:
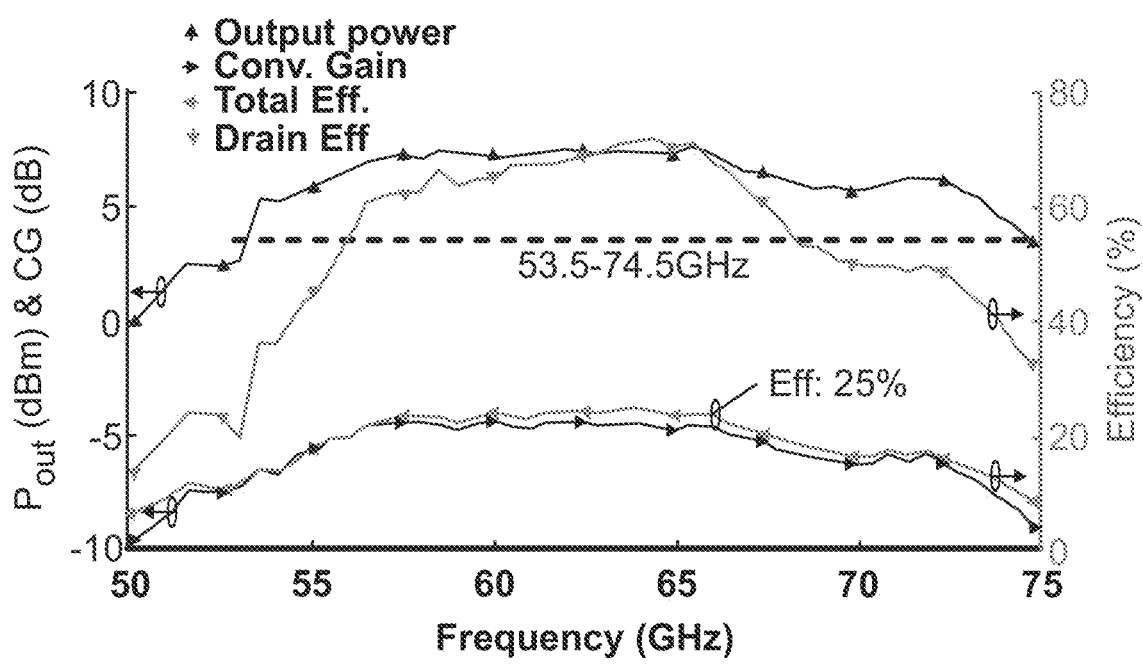
FIG. 27 illustrates various measured parameters for a CCR frequency doubler in accordance with one or more embodiments of the present invention.

Performance of the CCR frequency doubler as a function of frequency is characterized at the 1 dB compression point in FIG. 27. The CCR frequency doubler exhibited excellent broadband operation, with over 23 GHz of RF bandwidth. The total efficiency across the 3 dB bandwidth varies from 14 to 25%, and the drain efficiency ranges from 34 to 74%. Peak conversion gain is measured as −4.3 dB. $P_{SAT}$ as a function of applied bias is illustrated in FIG. 22B, where the total efficiency varied from 17 to 25% as $V_{GS}$ varied from 0 to −0.5V.

Figure 28:
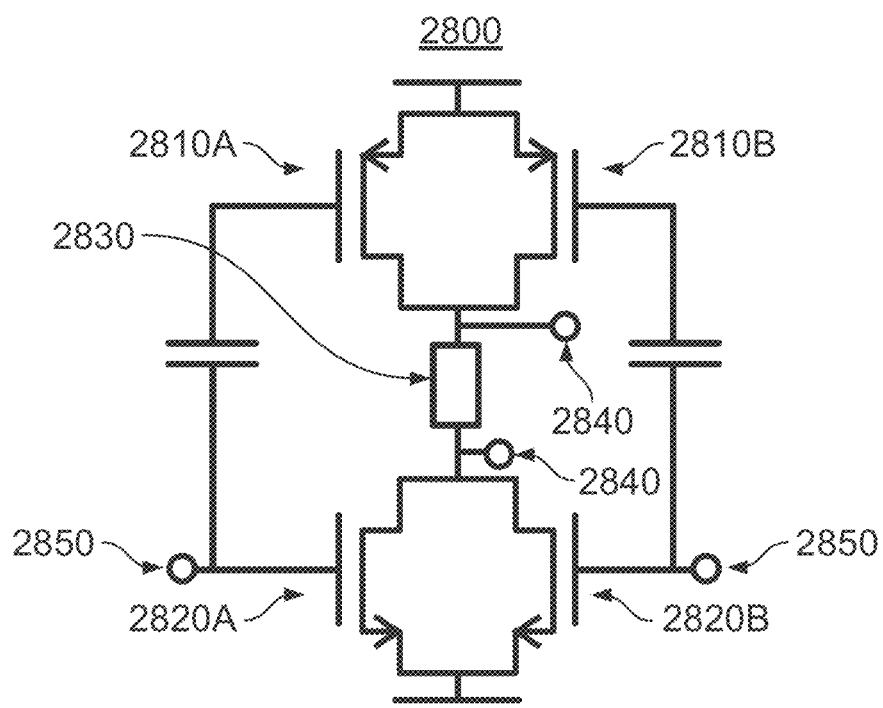
FIG. 28 illustrates a circuit schematic of a CCR frequency doubler in accordance with one or more embodiments of the present invention.

FIG. 28 illustrates a CCR frequency doubler 2800 in accordance with one or more embodiments of the present invention. The CCR frequency doubler 2800 includes a pair of PMOS transistors 2810A, 2810B coupled at their sources and drains, and a pair of NMOS transistors 2820A, 2820B, likewise coupled at their sources and drains. The drains of the PMOS transistors 2810A, 2810B are coupled to one end of a network 2830, while the drains of the NMOS transistors 2820A, 2820B are coupled to the other end of the network 2830. The drains of the PMOS transistors 2810A, 2810B and the drains of the NMOS transistors 2820A, 2820B thus serve as the output nodes 2840 of the CCR frequency doubler 2800. The input nodes 2850 of the CCR frequency doubler 2800 are coupled to the gates of the PMOS transistors 2810A, 2810B and the NMOS transistors 2820A, 2820B. Note that the network 2830 between the PMOS transistors 2810A, 2810B and the NMOS transistors 2820A, 2820B represents a network that provides either impedance matching or coupling to other devices in the overall signal processing chain.

Figure 29:
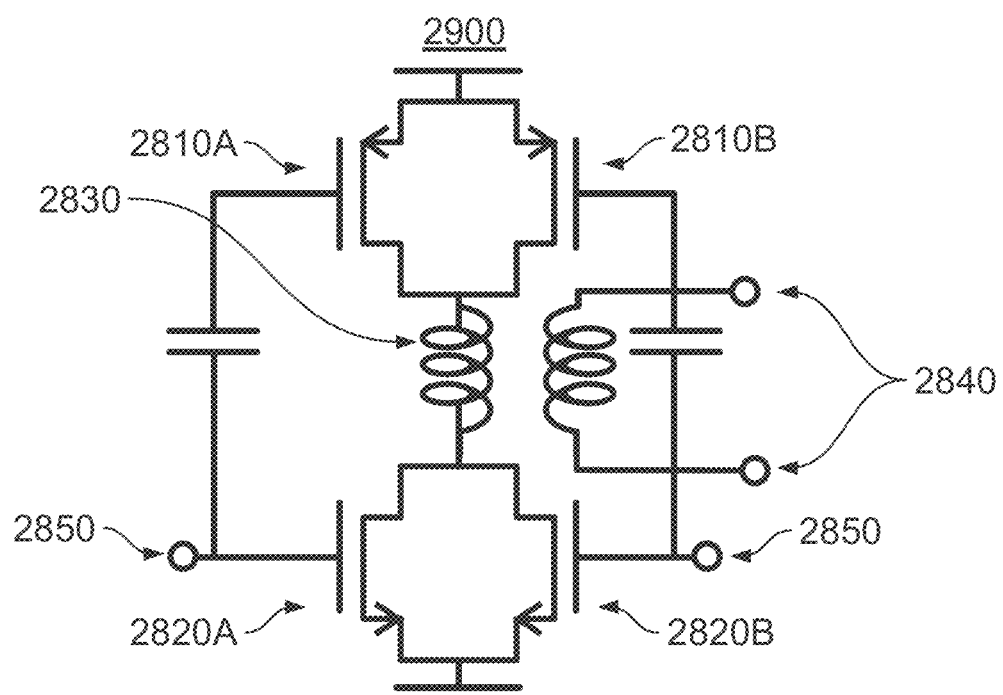
FIG. 29 illustrates a circuit schematic of a CCR frequency doubler in accordance with one or more embodiments of the present invention.

FIG. 29 illustrates a CCR frequency doubler 2900 in accordance with one or more embodiments of the present invention. CCR frequency doubler 2900 corresponds to CCR frequency doubler 2800, but with the network 2830 between the PMOS transistors 2810A, 2810B and the NMOS transistors 2820A, 2820B implementing a transformer-based coupling network. As the sources and drains of the PMOS transistors 2810A, 2810B and the NMOS transistors 2820A, 2820B are correspondingly coupled, the CCR frequency doublers 2800, 2900 are both of the push push type.

Figure 30:
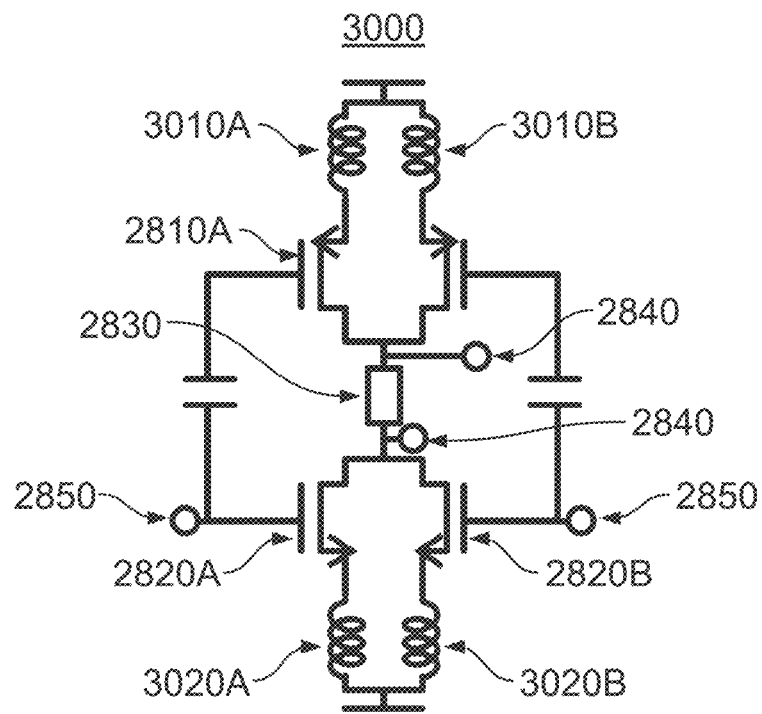
FIG. 30 illustrates a circuit schematic of a CCR frequency doubler in accordance with one or more embodiments of the present invention.

FIG. 30 illustrates a CCR frequency doubler 3000 in accordance with one or more embodiments of the present invention. CCR frequency doubler 3000 corresponds to CCR frequency doubler 2800, but with inductive degeneration, via harmonic terminating networks 3010A, 3010B, 3020A, 3020B, illustrated in FIG. 30 as inductors. The harmonic terminating networks 3010A, 3010B, 3020A, 3020B are used to present a real impedance at the input of the CCR frequency doubler 3000. Note that the harmonic terminating networks 3010A, 3010B, 3020A, 3020B may, for example, include inductors (formed in part or in whole of transmission lines), harmonic trapping resonators (formed, for example, of transmission lines or inductor/capacitor tank circuits), and/or resistors.

Figure 31:
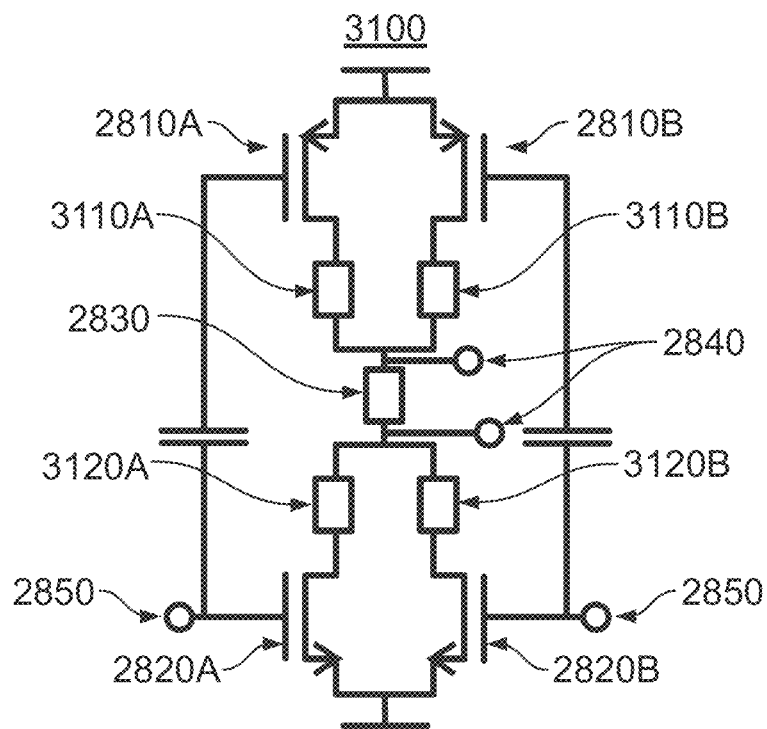
FIG. 31 illustrates a circuit schematic of a CCR frequency doubler in accordance with one or more embodiments of the present invention.

FIG. 31 illustrates a CCR frequency doubler 3100 in accordance with one or more embodiments of the present invention. CCR frequency doubler 3100 corresponds to CCR frequency doubler 2800, but with harmonic coupling networks 3110A, 3110B, 3120A, 3120B inserted for optimal harmonic conditioning. The harmonic coupling networks 3110A, 3110B, 3120A, 3120B present a desired coupling impedance or transimpedance at the desired output frequency. The harmonic coupling networks 3110A, 3110B, 3120A, 3120B may, for example, include inductors, harmonic trapping resonators (formed, for example, of transmission lines or inductor/capacitor tank circuits), and/or resistors.

Various features within CCR frequency doublers 2800-3100 may be combined with one another to provide additional capabilities as needed for a given application. Note that while CCR frequency doublers 2800-3100 are illustrated with various coupling capacitors for clarity, these coupling capacitors can typically be removed without affecting the overall functionality of the CCR frequency doublers 2800-3100.

While the above description described various embodiments of CCR frequency doublers, one can use multiple CCR frequency doublers in series to create higher even harmonic frequencies. For example, by serially coupling a first CCR frequency doubler to a second CCR frequency doubler, one can create a CCR frequency quadrupler in accordance with other embodiments. Alternatively, one can design a single stage CCR even harmonic multiplier where the output frequency would be an even harmonic of the input frequency, i.e., the output frequency would be $2nF_0$, where n is a positive integer. These designs would differ from the disclosed CCR frequency doublers because the output resonator would be tuned to the desired even harmonic frequency.

All publications, including but not limited to patents and patent applications, cited in this specification are herein incorporated by reference as though set forth in their entirety in the present application.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A device, comprising:
a complementary current reuse (CCR) even harmonic multiplier, including:
first and second PMOS transistors, drains of the first and second PMOS transistors coupled together at a first output node;
first and second NMOS transistors, drains of the first and second NMOS transistors coupled together at a second output node;
a first input node, the first input node coupled to gates of the first PMOS and first NMOS transistors; and
a second input node, the second input node coupled to gates of the second PMOS and second NMOS transistors;
wherein the first and second input nodes are adapted to receive an input signal at a frequency $F_0$;
wherein the first and second output nodes are adapted to output an output signal at a frequency $2nF_0$, where n is a positive integer; and
wherein sizes of the first and second PMOS transistors and the first and second NMOS transistors are adapted to provide substantially equivalent transconductances.

2. The device of claim 1, wherein performance of the first and second PMOS transistors are substantially the same as performance of the first and second NMOS transistors.

3. The device of claim 1, further comprising an input transformer, a secondary coil of the input transformer coupled between the first and second input nodes, a primary coil of the input transformer adapted to receive the input signal.

4. The device of claim 1, further comprising:
a first capacitor coupled between the gates of the first PMOS and first NMOS transistors; and
a second capacitor coupled between the gates of the second PMOS and second NMOS transistors.

5. The device of claim 1, further comprising first through fourth harmonic terminating networks, the first harmonic terminating network coupled to a source of the first PMOS transistor, the second harmonic terminating network coupled to a source of the second PMOS transistor, the third harmonic terminating network coupled to a source of the first NMOS transistor, and the fourth harmonic terminating network coupled to a source of the second NMOS transistor.

6. The device of claim 1, further comprising first through fourth harmonic coupling networks, the first harmonic coupling network coupled between the drain of the first PMOS transistor and the first output node, the second harmonic coupling network coupled between the drain of the second PMOS transistor and the first output node, the third harmonic coupling network coupled between the drain of the first NMOS transistor and the second output node, and the fourth harmonic coupling network coupled between the drain of the second NMOS transistor and the second output node.

7. The device of claim 1, further comprising a network coupled between the first and second output nodes, the network adapted to provide impedance matching or coupling.

8. The device of claim 7, wherein the network includes an output transformer, a primary coil of the output transformer coupled between the first and second output nodes, a secondary coil of the output transformer adapted to output the output signal.

9. The device of claim 7, wherein the network includes a triple transformer, the triple transformer including first and second primary coils and a first secondary coil, the first and second primary coils coupled between the first and second output nodes, the first and second primary coils being of opposite polarity, a terminal of the first secondary coil adapted to output the output signal.

10. The device of claim 9, wherein the network further includes:
a first coupling capacitor coupling the first primary coil to the first output node; and
a second coupling capacitor coupling the second primary coil to the second output node.

11. The device of claim 1, further comprising first through fourth coupling capacitors, the first coupling capacitor coupled between the source of the first PMOS transistor and the gate of the second PMOS transistor, the second coupling capacitor coupled between the source of the second PMOS transistor and the gate of the first PMOS transistor, the third coupling capacitor coupled between the source of the first NMOS transistor and the gate of the second NMOS transistor, and the fourth coupling capacitor coupled between the source of the second NMOS transistor and the gate of the first NMOS transistor.

12. The device of claim 1, further comprising:
an RF low noise amplifier adapted to amplify an input signal and output the amplified input signal;
a polyphase filter adapted to receive an oscillator signal, generate 0° and a desired offset angle phase-shifted oscillator signals, and output the 0° and desired offset angle phase-shifted oscillator signals;
wherein:
the first and second input nodes of the CCR even harmonic multiplier are adapted to receive a respective one of the 0° or desired offset angle phase-shifted oscillator signals;
the first and second output nodes are adapted to output a respective local oscillator (LO) signal at a frequency $2nF_0$ at a corresponding 0° or 90° phase shift, where n is a positive integer;
a second CCR even harmonic multiplier, the second CCR even harmonic multiplier including:
first and second PMOS transistors, drains of the first and second PMOS transistors coupled together at a first output node;
first and second NMOS transistors, drains of the first and second NMOS transistors coupled together at a second output node;
a first input node, the first input node coupled to gates of the first PMOS and first NMOS transistors; and
a second input node, the second input node coupled to gates of the second PMOS and second NMOS transistors;
wherein the first and second input nodes are adapted to receive a respective one of the 0° or desired offset angle phase-shifted oscillator signals; and
wherein the first and second output nodes are adapted to output a respective local oscillator (LO) signal at a frequency $2nF_0$ at a corresponding 0° or 90° phase shift, where n is a positive integer;
a mixer adapted to receive and mix the amplified input signal with the LO signals at the frequency $2nF_0$ at 0° and 900 phase shifts, and output corresponding I and Q signals; and
a pair of baseband low noise amplifiers, each of the pair of baseband low noise amplifiers adapted to receive a respective one of the I or Q signals, amplify the respective one of the I or Q signals, and output a respective one of the thus amplified I or Q signals.

13. The device of claim 12, wherein performance of the first and second PMOS transistors of each of the CCR even harmonic multiplier and the second CCR even harmonic multiplier are substantially the same as performance of the first and second NMOS transistors of each of the CCR even harmonic multiplier and the second CCR even harmonic multiplier.

14. The device of claim 12, wherein each of the pair of CCR even harmonic multipliers further comprises an input transformer, a secondary coil of the input transformer coupled between the first and second input nodes, a primary coil of the input transformer adapted to receive a respective one of the 0° or desired offset angle phase-shifted oscillator signals.

15. The device of claim 12, wherein each of the CCR even harmonic multiplier and the second CCR even harmonic multiplier further comprises:
a first capacitor coupled between the gates of the first PMOS and first NMOS transistors; and
a second capacitor coupled between the gates of the second PMOS and second NMOS transistors.

16. The device of claim 12, wherein each of the pair of CCR even harmonic multipliers further comprises first through fourth harmonic terminating networks, the first harmonic terminating network coupled to a source of the first PMOS transistor, the second harmonic terminating network coupled to a source of the second PMOS transistor, the third harmonic terminating network coupled to a source of the first NMOS transistor, and the fourth harmonic terminating network coupled to a source of the second NMOS transistor.

17. The device of claim 12, wherein each of the pair of CCR even harmonic multipliers further comprises first through fourth harmonic coupling networks, the first harmonic coupling network coupled between the drain of the first PMOS transistor and the first output node, the second harmonic coupling network coupled between the drain of the second PMOS transistor and the first output node, the third harmonic coupling network coupled between the drain of the first NMOS transistor and the second output node, and the fourth harmonic coupling network coupled between the drain of the second NMOS transistor and the second output node.

18. The device of claim 12, wherein each of the CCR even harmonic multiplier and the second CCR even harmonic multiplier further comprises a network coupled between the first and second output nodes, the network including an output transformer or a triple transformer, the network adapted to provide impedance matching or coupling.

19. The device of claim 12, wherein each of the pair of CCR even harmonic multipliers further comprises first through fourth coupling capacitors, the first coupling capacitor coupled between the source of the first PMOS transistor and the gate of the second PMOS transistor, the second coupling capacitor coupled between the source of the second PMOS transistor and the gate of the first PMOS transistor, the third coupling capacitor coupled between the source of the first NMOS transistor and the gate of the second NMOS transistor, and the fourth coupling capacitor coupled between the source of the second NMOS transistor and the gate of the first NMOS transistor.

* * * * *